(12) United States Patent
Sakamoto et al.

(10) Patent No.: US 10,578,663 B2
(45) Date of Patent: Mar. 3, 2020

(54) INSPECTION DEVICE AND INSPECTION METHOD FOR PERFORMING DYNAMIC AND STATIC CHARACTERISTICS TESTS

(71) Applicant: SINTOKOGIO, LTD., Nagoya-shi, Aichi (JP)

(72) Inventors: Yoichi Sakamoto, Aichi (JP); Takayuki Hamada, Aichi (JP); Nobuyuki Takita, Aichi (JP)

(73) Assignee: SINTOKOGIO, LTD., Nagoya-shi, Aichi (JP)

( * ) Notice: Subject to any disclaimer, the term of this patent is extended or adjusted under 35 U.S.C. 154(b) by 39 days.

(21) Appl. No.: 15/568,849

(22) PCT Filed: Mar. 14, 2016

(86) PCT No.: PCT/JP2016/057892
§ 371 (c)(1),
(2) Date: Oct. 24, 2017

(87) PCT Pub. No.: WO2016/174944
PCT Pub. Date: Nov. 3, 2016

(65) Prior Publication Data
US 2018/0113165 A1 Apr. 26, 2018

(30) Foreign Application Priority Data
Apr. 28, 2015 (JP) .................. 2015-091957

(51) Int. Cl.
*G01R 31/26* (2014.01)
*G01R 31/28* (2006.01)

(52) U.S. Cl.
CPC ..... *G01R 31/2601* (2013.01); *G01R 31/2632* (2013.01); *G01R 31/2886* (2013.01);
(Continued)

(58) Field of Classification Search
CPC ............ G01R 31/2601; G01R 31/2621; G01R 31/2632; G01R 31/2608; G01R 31/2891
See application file for complete search history.

(56) References Cited

U.S. PATENT DOCUMENTS

| 5,381,417 A * | 1/1995 | Loopik ............. G01R 31/2806 702/117 |
| 7,924,035 B2 * | 4/2011 | Huebner .......... G01R 31/31926 324/754.01 |
| 2012/0081139 A1 * | 4/2012 | Yoshida ............. G01R 31/2608 324/750.16 |

FOREIGN PATENT DOCUMENTS

| CN | 2572557 Y | 9/2003 |
| CN | 101084445 A | 12/2007 |

(Continued)

OTHER PUBLICATIONS

International Preliminary Report on Patentability dated Nov. 9, 2017 for PCT/JP2016/057892.
(Continued)

*Primary Examiner* — Minh N Tang
(74) *Attorney, Agent, or Firm* — Drinker Biddle & Reath LLP

(57) ABSTRACT

An inspection device comprises a stage for placing a device under test thereon, a dynamic characteristics test probe, a static characteristics test probe, and a control device configured to perform positional control by moving at least one of the stage, the dynamic characteristics test probe, and the static characteristics test probe. The control device performs the positional control such that the dynamic characteristics test probe is set to a dynamic characteristics test state in which the dynamic characteristics test probe is brought into contact with the electrode when the dynamic characteristics test is performed, and performs the positional control such that the static characteristics test probe is set to a static
(Continued)

characteristics test state in which the static characteristics test probe is brought into contact with the electrode while the dynamic characteristics test probe is separated from the electrode when the static characteristics test is performed.

15 Claims, 24 Drawing Sheets

(52) U.S. Cl.
CPC ...... *G01R 31/2891* (2013.01); *G01R 31/2608* (2013.01); *G01R 31/2621* (2013.01)

(56) References Cited

FOREIGN PATENT DOCUMENTS

| | | |
|---|---|---|
| CN | 101101886 A | 1/2008 |
| CN | 101639509 A | 2/2010 |
| CN | 102539992 A | 7/2012 |
| JP | 2005-121553 A | 5/2005 |
| JP | 2012-078174 A | 4/2012 |
| TW | 201144832 A | 12/2011 |

OTHER PUBLICATIONS

Cao Yufeng, Ll Qi, "Research and Development of Test System of Direct Current Parameters of Power Semiconductor Devices", 2013, p. 58-p. 60, with English language translation.

\* cited by examiner

INSPECTION DEVICE AND INSPECTION METHOD FOR PERFORMING DYNAMIC AND STATIC CHARACTERISTICS TESTS

TECHNICAL FIELD

The present disclosure relates to an inspection device and an inspection method.

BACKGROUND ART

Inspection of a device such as a power semiconductor module includes a dynamic characteristics (AC: Alternating Current) test and a static characteristics (DC: Direct Current) test. In the inspection, two kinds of testers, a dynamic characteristics tester and a static characteristics tester, are used.

For example, Patent Literature 1 discloses an integrated testing apparatus comprising a dynamic characteristics tester and a static characteristics tester. This integrated testing apparatus electrically connects the dynamic characteristics tester and static characteristics tester with electrodes of a device under test (DUT: Device Under Test) via an intermediate electrode plate. This allows both tests, the dynamic characteristics test and the static characteristics test, to be performed by means of one integrated testing apparatus.

CITATION LIST

Patent Literature

Patent Literature 1: Japanese Unexamined Patent Publication No. 2012-78174

SUMMARY OF INVENTION

Technical Problem

With improvement of a device performance, improvement of inspection accuracy has been demanded. In the integrated testing apparatus described in Patent Literature 1, since the dynamic characteristics test and the static characteristics test are performed via the intermediate electrode plate, measurement results by the testers are liable to be affected by inductance of the inter mediate electrode plate. For example, in the dynamic characteristics test including measuring a switching time of the device under test, the inspection accuracy is liable to decrease by being increasingly affected by the inductance of the intermediate electrode plate.

The present disclosure provides an inspection device and inspection method capable of improving the inspection accuracy of a device such as a power semiconductor module.

Solution to Problem

An inspection device according to an aspect of the present disclosure comprises a stage for placing a device under test thereon, a dynamic characteristics test probe for electrically connecting an electrode of the device under test with a dynamic characteristics tester for performing a dynamic characteristics test, a static characteristics test probe for electrically connecting the electrode with a static characteristics tester for performing a static characteristics test, and a control device configured to perform positional control by moving at least one of the stage, the dynamic characteristics test probe, and the static characteristics test probe. The control device performs the positional control such that the dynamic characteristics test probe is set to a dynamic characteristics test state in which the dynamic characteristics test probe is brought into contact with the electrode when the dynamic characteristics test is performed, and performs the positional control such that the static characteristics test probe is set to a static characteristics test state in which the static characteristics test probe is brought into contact with the electrode while the dynamic characteristics test probe is separated from the electrode when the static characteristics test is performed.

An inspection method according to another aspect of the present disclosure comprises a dynamic characteristics test step of bring a dynamic characteristics test probe into contact with an electrode of a device under test to perform a dynamic characteristics test, and a static characteristics test step of bring a static characteristics test probe into contact with the electrode to perform a static characteristics test. In the static characteristics test step, positional control is performed such that the dynamic characteristics test probe is separated from the electrode by moving at least one of a stage placing the device under test thereon, the dynamic characteristics test probe, and the static characteristics test probe.

According to the above inspection system and inspection method, the dynamic characteristics test is performed by the dynamic characteristics tester in a state that the dynamic characteristics test probe is in contact with the electrode of the device under test. In addition, the static characteristics test is performed by the static characteristics tester in a state that static characteristics test probe is in contact with the electrode of the device under test. The term "contact" as used herein means that each probe contacts with the electrode not via another element (e.g., an intermediate electrode plate used in related art or the like) (that is, each probe physically contacts with the electrode). For this reason, each tester can be electrically connected with a device under test with smaller inductance component as compared with a configuration as in related art in which each tester is connected with an electrode of a device under test via an intermediate electrode, for example. As a result, it is possible to improve measurement accuracy of the dynamic characteristics test which is particularly prone to be affected by the inductance component. Further, according to the above inspection system and inspection method, while the static characteristics test is performed, the dynamic characteristics test probe is separate from the electrode of the device under test. For example, it may be also considered to, instead of the dynamic characteristics test probe being separated from the electrode of the device under test, provide a relay between the dynamic characteristics test probe and the dynamic characteristics tester to electrically disconnect the dynamic characteristics tester. However, in this case, the measurement accuracy of the dynamic characteristics test is decreased by being affected by the inductance component of the relay. By physically separating the dynamic characteristics test probe from the electrode of the device under test as described above, a configuration can be obtained in which a relay is not provided between the dynamic characteristics test probe and the dynamic characteristics tester, preventing the measurement accuracy of the dynamic characteristics test from decreasing caused by the inductance component of the relay. Accordingly, it is possible to improve the inspection accuracy of the device under test.

The above inspection device may comprise a disconnecting circuit configured to electrically disconnect the static characteristics test probe from the static characteristics tester, the control device may perform the positional control such that a state of all of the dynamic characteristics test probe and the static characteristics test probe are in contact with the electrode as the dynamic characteristics test state, and the disconnecting circuit may electrically disconnect the static characteristics test probe from the static characteristics tester when the dynamic characteristics test is performed. For example, it may be considered to move the static characteristics test probe to electrically disconnect the static characteristics tester from the electrode of the device under test, but in this case, an additional moving mechanism for moving the static characteristics test probe is required as well as machine design or the like therefor is required. By adopting the configuration as described above in which the static characteristics test probe is electrically disconnected from the static characteristics tester by the disconnecting circuit, such a moving mechanism and machine design may be unnecessary.

The dynamic characteristics test probe and the static characteristics test probe may be arranged in such a way as to be brought into contact with the electrode from a lower part of the device under test, and the control device, by moving the dynamic characteristics test probe in an up-and-down direction, may switch a contact state among the dynamic characteristics test probe, the static characteristics test probe, and the electrode between the dynamic characteristics test state and the static characteristics test state. By doing so also, it is possible to achieve the positional control described above. In this case, the elements included in the inspection device such as the static characteristics test probe and the dynamic characteristics test probe can be collectively arranged at downward portions of the inspection device (e.g., portions on a side lower than the stage). This allows the inspection device to be made compact.

The dynamic characteristics test probe may be arranged in such a way as to be brought into contact with the electrode from a lower part of the device under test, the static characteristics test probe may be arranged in such a way as to be brought into contact with the electrode from an upper part of the device under test, and the control device, by moving the static characteristics test probe and the dynamic characteristics test probe in an up-and-down direction, may switch a contact state among the dynamic characteristics test probe, the static characteristics test probe, and the electrode between the dynamic characteristics test state and the static characteristics test state. By doing so also, it is possible to achieve the positional control described above.

The dynamic characteristics test probe may be arranged in such a way as to be brought into contact with the electrode from a lower part of the device under test, the static characteristics test probe may be arranged in such a way as to be brought into contact with the electrode from an upper part of the device under test, and the control device, by moving the stage in an up-and-down direction, may switch a contact state among the dynamic characteristics test probe, the static characteristics test probe, and the electrode between the dynamic characteristics test state and the static characteristics test state. By doing so also, it is possible to achieve the positional control described above.

The dynamic characteristics test probe and the static characteristics test probe may be arranged in such a way as to be brought into contact with the electrode from an upper part of the device under test, and the control device, by moving the stage and the dynamic characteristics test probe in an up-and-down direction, may switch a contact state among the dynamic characteristics test probe, the static characteristics test probe, and the electrode between the dynamic characteristics test state and the static characteristics test state. By doing so also, it is possible to achieve the positional control described above.

The static characteristics test probe may be a spring probe capable of expansion and contraction in an up-and-down direction and may be arranged in such a way as to be brought into contact with the electrode from an upper part of the device under test, the dynamic characteristics test probe may be arranged in such a way as to be brought into contact with the electrode from an upper part of the device under test, with an end of the dynamic characteristics test probe being positioned upper than an end of the static characteristics test probe, and the control device, by moving the stage in the up-and-down direction, may switch a contact state among the dynamic characteristics test probe, the static characteristics test probe, and the electrode between the dynamic characteristics test state and the static characteristics test state. By doing so also, it is possible to achieve the positional control described above.

The dynamic characteristics test probe and the static characteristics test probe may be arranged in such a way as to be brought into contact with the electrode from an upper part of the device under test, and the control device, by moving the dynamic characteristics test probe and the static characteristics test probe in an up-and-down direction, may switch a contact state among the dynamic characteristics test probe, the static characteristics test probe, and the electrode between the dynamic characteristics test state and the static characteristics test state. By doing so also, it is possible to achieve the positional control described above.

Advantageous Effects of Invention

According to the present disclosure, it is possible to improve the inspection accuracy of a device such as a power semiconductor module.

DESCRIPTION OF EMBODIMENTS

Hereinafter, a description is given of embodiments of the present disclosure with reference to the drawings. The same components are designated by the same reference signs, and the duplicated description is omitted, if possible. Dimensions and shapes in the respective figures are not necessarily the same as those in an actual case.

Figure 1:
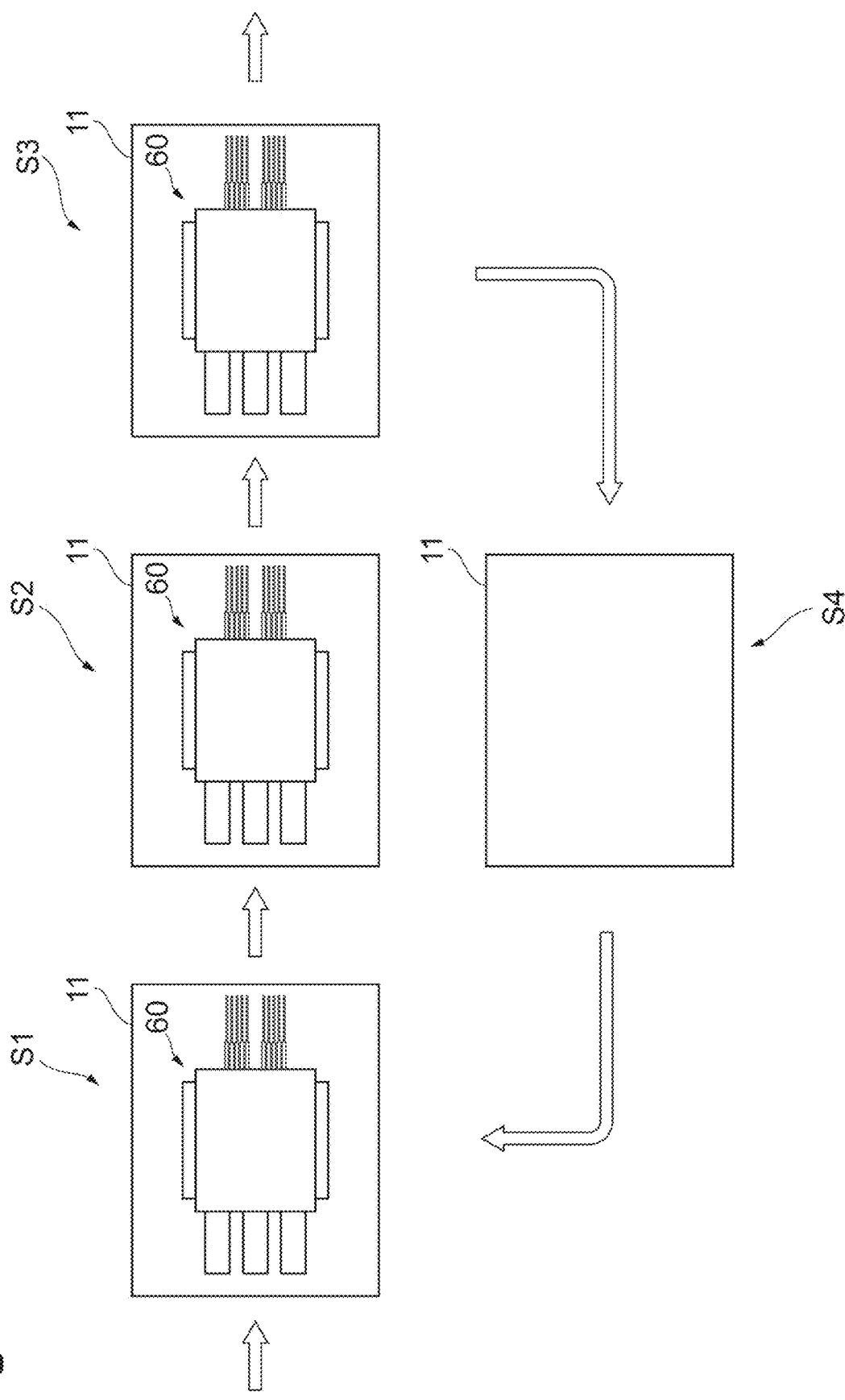
FIG. 1 is a diagram schematically illustrating a linear type inspection system.
Figure 2:
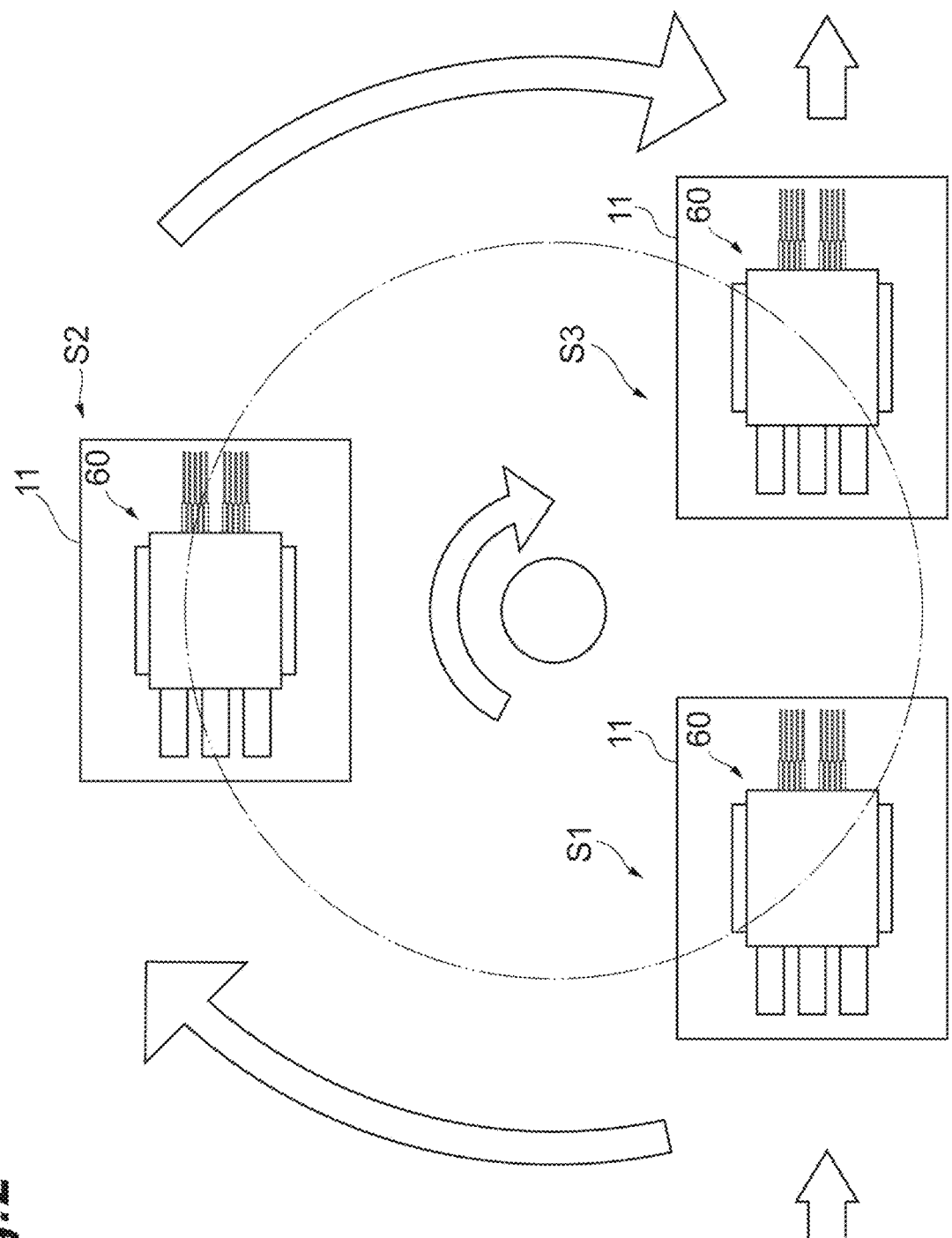
FIG. 2 is a diagram schematically illustrating a rotary type inspection system.

First, a description is given of main components common to the respective embodiments. In an inspection device according to the respective embodiments, a device such as a power semiconductor module is used as a device under test (DUT), and a dynamic characteristics test and a static characteristics test are performed on the DUT. For example, in a linear type inspection system schematically illustrated in FIG. 1, performed along linear traveling of a stage 11 are step S1 of importing a DUT 60 before the inspection and placing the DUT 60 on the stage 11, step S2 of performing the dynamic characteristics test and the static characteristics test, and step S3 of exporting the DUT 60 after the inspection. Note that after step S3 is completed, also performed is return step S4 of moving the stage 11 to a position where the process of step S1 is performed in order to use again the stage 11 in step S1. In a rotary type inspection system schematically illustrated in FIG. 2, steps S1 to S3 described above are performed along rotational traveling of the stage 11.

Figure 3:
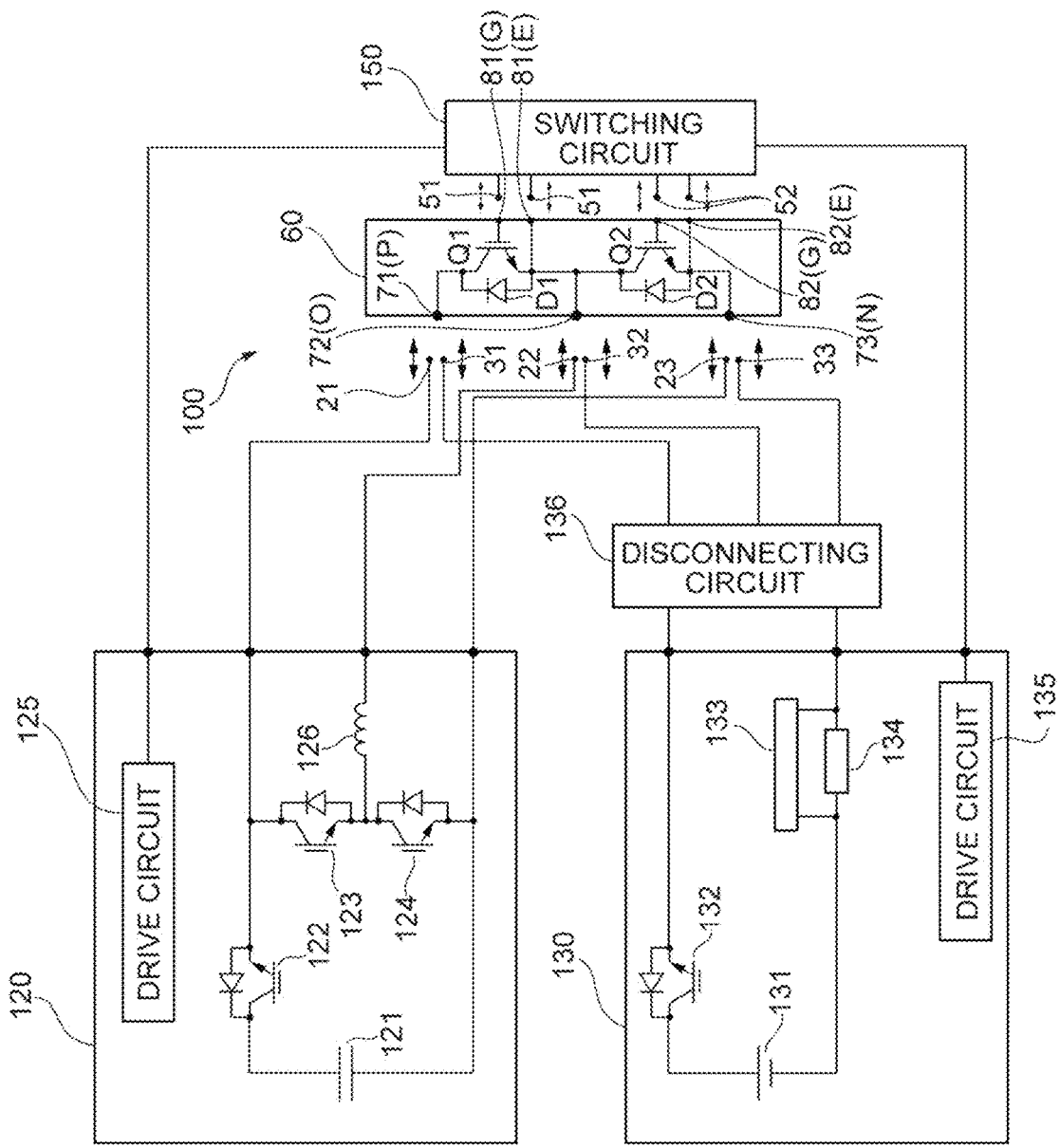
FIG. 3 is a diagram illustrating a measurement circuit in an inspection device common to the respective embodiments.

FIG. 3 is a diagram illustrating an exemplary circuit configuration of the dynamic characteristics tester and static characteristics tester used in step S2 described above. In the example illustrated in FIG. 3, the DUT 60 is a power module including transistors Q1 and Q2, diodes D1 and D2, a P-pole electrode 71, an output electrode 72, an N-pole electrode 73, a plurality of control electrodes 81, and a plurality of control electrodes 82. In the example illustrated in FIG. 3, the transistors Q1 and Q2 each are an IGBT (Insulated Gate Bipolar Transistor), but the transistors Q1 and Q2 each may be an FET (Field Effect Transistor), for example. The transistor Q1 can be used for an upper arm of a one-phase inverter circuit, and the transistor Q2 can be used for a lower arm. Each of the diodes D1 and D2 is a free wheel diode connected with each of the transistors Q1 and Q2. The P-pole electrode 71 is connected with a collector of the transistor Q1. The output electrode 72 is connected with an emitter of the transistor Q1 and a collector of the transistor Q2. The N-pole electrode 73 is connected with an emitter of the transistor Q2. Note that the P-pole electrode 71, the output electrode 72, and the N-pole electrode 73 are designated respectively by reference characters P, O, and N in parentheses in FIG. 3 for easy differentiation. The control electrodes 81 include a portion connected with a gate of the transistor Q1 (shown as a control electrode 81(G)) and a portion connected with the emitter of the transistor Q1 (shown as a control electrode 81(E)). The control electrodes 82 include a portion connected with a gate of the transistor Q2 (shown as a control electrode 82(G)) and a portion connected with the emitter of the transistor Q2 (shown as a control electrode 82(E)).

An inspection device 100 includes probes 21 to 23, probes 31 to 33, probes 51 and 52, a disconnecting circuit 136, and a switching circuit 150. The probes 21 to 23 each are a dynamic characteristics test probe (first probe) for electrically connecting the P-pole electrode 71, the output electrode 72, and the N-pole electrode 73 with a dynamic characteristics tester 120. The probes 31 to 33 each are a static characteristics test probe (second probe) for electrically connecting the P-pole electrode 71, the output electrode 72, and the N-pole electrode 73 with the static characteristics tester 130. The probes 51 and 52 each are a probe (third probe) for electrically connecting the control electrodes 81 and 82 with a drive circuit 125 of the dynamic characteristics tester 120 or a drive circuit 135 of the static characteristics tester 130 which are described later.

The dynamic characteristics tester 120 performs the dynamic characteristics test on the DUT 60. For example, the dynamic characteristics tester 120 uses a testing circuit including the drive circuit 125, a capacitor 121, transistors 122 to 124, and a reactor 126 to perform measurement of switching times of the transistors Q1 and Q2 included in the DUT 60 or the like. Besides this, various tests such as measurement of a short-circuit safe operation area and measurement of avalanche are included in the dynamic characteristics test performed by the dynamic characteristics tester 120.

The static characteristics tester 130 performs the static characteristics test on the DUT 60. For example, the static characteristics tester 130 uses a testing circuit including the drive circuit 135, a high-voltage source 131, a transistor 132, a current measuring circuit 133, and a current sensing resistor 134 to perform measurement of ON-voltages of the transistors Q1 and Q2 and diodes D1 and D2 included in the DUT 60 or the like. Besides this, various tests such as measurement of a leakage current and measurement of a cut-off voltage are included in the static characteristics test performed by the static characteristics tester 130.

The disconnecting circuit 136 electrically disconnects the probes 31 to 33 from the static characteristics tester 130. The switching circuit 150 switches an electrical connection of the probes 51 and 52 with the drive circuit 125 of the dynamic characteristics tester 120 and the drive circuit 135 of the static characteristics tester 130. Details of the disconnecting circuit 136 and the switching circuit 150 are described later with reference to FIGS. 20 to 24.

According to an inspection method performed in the inspection device 100, when the dynamic characteristics test is performed by the dynamic characteristics tester 120, positional control is performed such that the probes 21 to 23 each are brought into a state of contacting with the P-pole electrode 71, the output electrode 72, and the N-pole electrode 73, respectively, of the DUT 60 (dynamic characteristics test state). In addition, in the inspection device 100, when the static characteristics test is performed by the static characteristics tester 130, the positional control is performed such that the probes 31 to 33 each are brought into a state of contacting with the P-pole electrode 71, the output electrode 72, and the N-pole electrode 73, respectively, of the DUT 60 (static characteristics test state) while the probes 21 to 23 each are separated from the P-pole electrode 71, the output electrode 72, and the N-pole electrode 73, respectively, of the DUT 60. Note that the positional control is performed by a control device 40 described later (in FIG. 4 or the like).

The control device 40 may perform the positional control such that all of the probes 21 to 23 and the probes 31 to 33 are brought into the state of contacting with the P-pole electrode 71, the output electrode 72, and the N-pole electrode 73 of the DUT 60 as the dynamic characteristics test state. In this case, when the dynamic characteristics test is performed by the dynamic characteristics tester 120, the disconnecting circuit 136 electrically disconnects the probes 31 to 33 from the static characteristics tester 130.

Hereinafter, a description is given of the inspection device according to the embodiments.

First Embodiment

Figure 4:
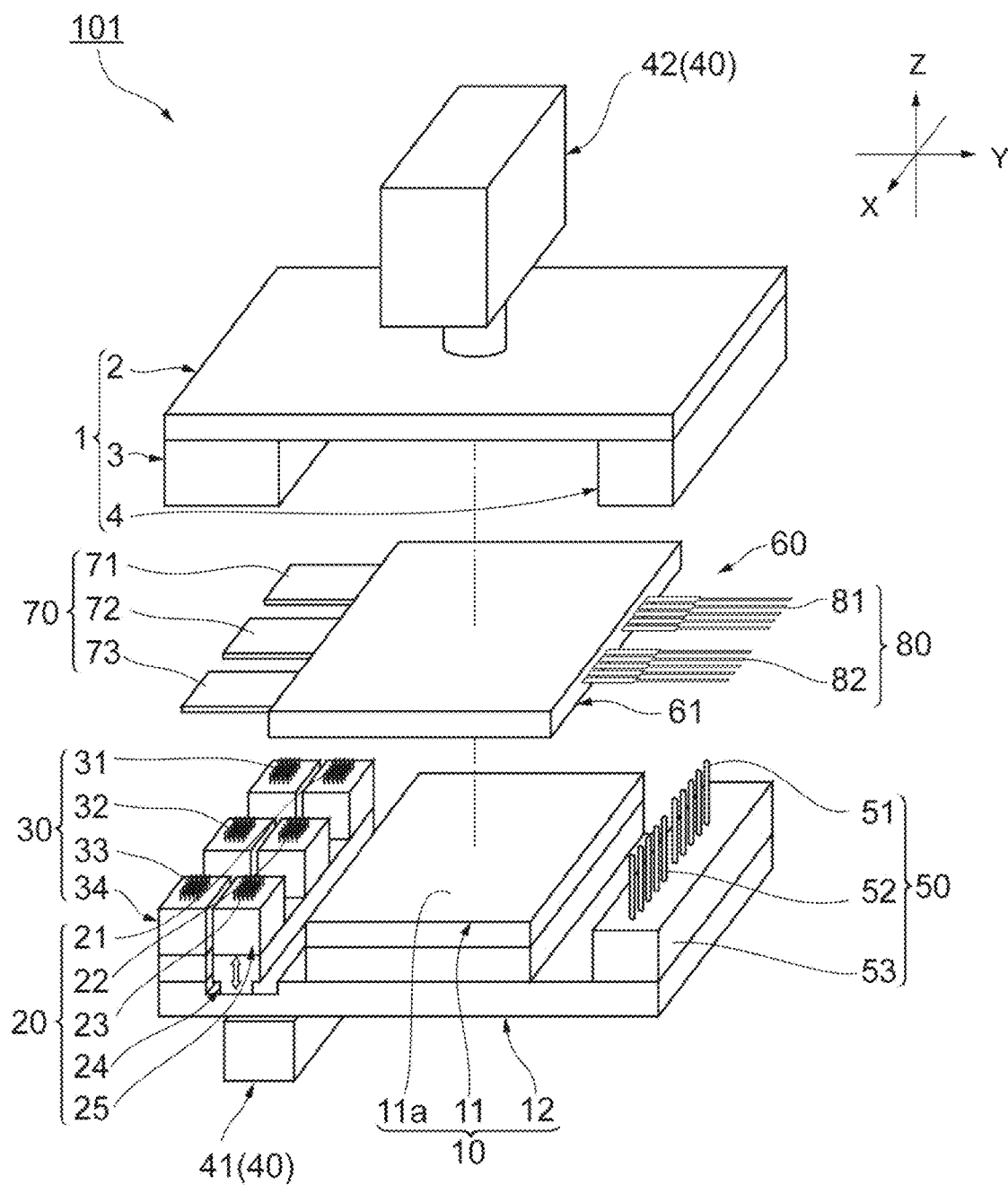
FIG. 4 is a perspective view showing a schematic configuration of an inspection device according to a first embodiment.
Figure 5:
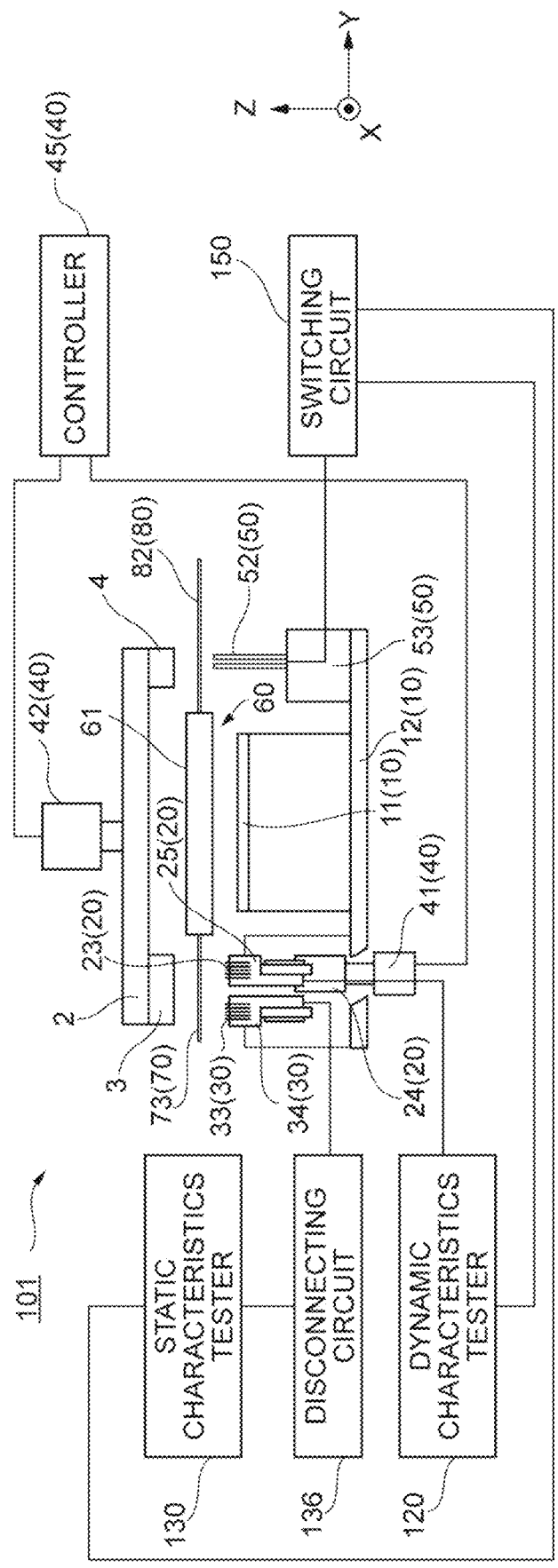
FIG. 5 is a front view of the inspection device according to the first embodiment.

FIG. 4 is a perspective view showing a schematic configuration of an inspection device 101 according to a first embodiment. FIG. 5 is a front view of the inspection device 101 illustrated in FIG. 1. Note that, of elements included in the inspection device 101, the control device 40, the disconnecting circuit 136, and the switching circuit 150 are schematically illustrated, and positions and sizes of the control device 40, the disconnecting circuit 136, and the switching circuit 150 are not necessarily accurately shown. The same holds for the dynamic characteristics tester 120 and the static characteristics tester 130.

As shown in FIG. 4 and FIG. 5, the DUT 60 includes a main body 61, an electrode 70, and an electrode 80. The main body 61 has a plate shape. The main body 61 includes the transistors Q1 and Q2 and the diodes D1 and D2 (in FIG. 3). The main body 61 is molded by a resin, for example. The electrode 70 consists of the P-pole electrode 71, the output electrode 72, and the N-pole electrode 73. The electrode 70 is an electrode extending from one lateral face of four lateral faces of the main body 61 toward the outside of the main body 61 and perpendicularly to the lateral face. Along that lateral face, the P-pole electrode 71, the output electrode 72, and the N-pole electrode 73 are arranged to be aligned in this order. The electrode 80 consists of the control electrodes 81 and the control electrodes 82. The electrode 80 is an electrode extending from a lateral face of main body 61 on the opposite side of the electrode 70 with respect to the main body 61 toward the outside of the main body 61 and perpendicularly to the lateral face. Along that lateral face, the control electrodes 81 and the control electrodes 82 are arranged to be aligned in this order. Note that in the example shown in FIG. 4, the number of the control electrodes 81 and the number of the control electrodes 82 are respectively five, but the numbers of the control electrodes 81 and control electrodes 82 are not limited thereto. The control electrodes 81 may include at least the control electrode 81 (G) and the control electrode 81(E) shown in FIG. 3, and the control electrodes 82 may include at least the control electrode 82 (G) and the control electrode 82 (E).

The inspection device 101 includes a fastening unit 1, a pedestal unit 10, a dynamic characteristics test probe unit 20, a static characteristics test probe unit 30, the control device 40, a probe unit 50, the disconnecting circuit 136, and the switching circuit 150.

The pedestal unit 10 includes the stage 11 and an insulating base 12. The stage 11 is an insulated stage provided on the insulating base 12. The DUT 60 is placed on the stage 11. The stage 11 has a pedestal face 11a. The pedestal face 11a supports the main body 61 of the DUT 60. When the pedestal face 11a is planarly viewed, at least a part of the electrodes 70 and at least a part of the electrodes 80 of the DUT 60 are positioned outside the pedestal face 11a.

Note that an XYZ coordinate system are set in the figure in order to illustrate directions of the inspection device 101. This XYZ coordinate system is set with the pedestal face 11a of the stage 11 being defined as an XY plane. An X-axis and a Y-axis are orthogonal to each other, and a Z-axis is orthogonal to the XY plane. In other words, the Z-axis is in a direction orthogonal to the pedestal face 11a of the stage 11. A Z-axis positive direction is an "upward" direction and a Z-axis negative direction is a "downward" direction, unless otherwise specifically described herein. However, in a scope without departing from a gist of the present disclosure, the Z-axis positive direction may be read as the downward direction and the Z-axis negative direction may be read as the upward direction.

The dynamic characteristics test probe unit 20 includes the probes 21 to 23, a movable base 24, and a probe holder 25. The probe 21 is configured to have low inductance characteristics and to allow a large current (e.g., current of about 100 A to 10 kA). Specifically, the probe 21 is constituted by a plurality of (e.g., about several to a hundred) short/small probes. A length of each short/small probe is about 1 mm to 10 mm, for example. By the probe 21 being constituted by the short/small probes, the low inductance characteristics of the probe 21 are achieved. In addition, by the probe 21 being constituted by a plurality of short/small probes, the probe 21 can allow a large current. The probe 22 and the probe 23 are also constituted by a plurality of short/small probes similarly to the probe 21. Each probe may be a scrub type probe or a spring type probe, for example. In the case of the scrub type probe, a tip end portion of each probe contacts with the electrode 70 while scrubbing a surface of the electrode 70. In the case of the spring type probe, a tip end portion of each probe contacts with the electrode 70 by use of expansion and contraction of a spring. The spring type probe is more general-purpose and more inexpensive than the scrub type probe. The probe holder 25 houses the probes 21 to 23 in such a way as that the tip end portions of the probes 21 to 23 upwardly protrude from the probe holder 25. The movable base 24 is a component supporting the probe holder 25. The movable base 24 is driven in an up-and-down direction by an up-and-down driving unit 41 described later. The probes 21 to 23 each are positioned at downward sides of the P-pole electrode 71, the output electrode 72, and the N-pole electrode 73, respectively, of the DUT 60 in a state that the DUT 60 is placed on the stage 11.

The static characteristics test probe unit 30 includes the probes 31 to 33 and a probe holder 34. The probes 31 to 33 each are constituted by a plurality of contact probes, for example, similarly to the probe 21 to the probe 23. The probe holder 34 houses the probes 31 to 33 in such a way as that tip end portions of the probes 31 to 33 upwardly protrude from the probe holder 34. The probes 31 to 33 are constituted by a plurality of short/small probes similarly to the probes 21 to 23. The probe holder 34 is fixed to the insulating base 12. The tip end portions of the probes 31 to 33 are positioned upper than the pedestal face 11a of the stage 11 so as to be in contact with the electrode 70 in a state that the DUT 60 is placed on the stage 11. The probes 31 to 33 each are positioned at the downward sides of the P-pole electrode 71, the output electrode 72, and the N-pole electrode 73, respectively, of the DUT 60 in a state that the DUT 60 is placed on the stage 11.

In the inspection device 101, the probe 21 and the probe 31 are aligned side by side in such a way as to be respectively brought into contact with different portions on the P-pole electrode 71 of the DUT 60 from a lower part of the DUT 60. The probe 22 and the probe 32 are aligned side by side in such a way as to be respectively brought into contact with different portions on the output electrode 72 of the DUT 60 from the lower part of the DUT 60. The probe 23 and the probe 33 are aligned side by side in such a way as to be respectively brought into contact with different portions on the N-pole electrode 73 of the DUT 60 from the lower part of the DUT 60. The probes 21 to 23 and the probes 31 to 33 are aligned in an XY plane direction side by side in such a way as to be respectively brought into contact with different portions on the electrode 70 of the DUT 60.

The probe unit 50 includes the probes 51 and 52, and a probe holder 53. The probes 51 and 52 each are constituted by a plurality of pins. The number of the pins constituting the probe 51 is the same as the number of the control electrodes 81 of the DUT 60, and the number of the pins constituting the probe 52 is the same as the number of the control electrodes 82 of the DUT 60. The probes 51 and 52 each are a spring type probe which is supported in the probe holder 53 by a spring not shown, for example, and is capable of expansion and contraction in the up-and-down direction by means of expansion and contraction of the relevant spring. The probe holder 53 houses the probes 51 and 52 in such a way as that tip end portions of the probes 51 and 52 upwardly protrude from the probe holder 53. The probe holder 53 is fixed to the insulating base 12. The probes 51 and 52 each are positioned at downward sides of the control electrodes 81 and 82, respectively, of the DUT 60 in a state that the DUT 60 is placed on the stage 11. The tip end portions of the probes 51 and 52 are positioned upper than the pedestal face 11a of the stage 11 so as to be in contact with the electrode 80 by use of, for example, the expansion and contraction of the spring described above in a state that the DUT 60 is placed on the stage 11.

The current scarcely flows in the probes 51 and 52 as compared to the probes 21 to 23 and the probes 31 to 33. For this reason, the number of the pins constituting the probes 51 and 52 and a size of a diameter of the pin are properly defined in view of ensuring an electrical connection between the probes 51 and 52 and the electrode 80.

The fastening unit 1 includes a holddown base 2 and holddown blocks 3 and 4. The holddown base 2 is a plate-shaped block arranged to face the stage 11. The holddown block 3 is an insulating block which is provided on a lower face of the holddown base 2 and arranged to face the probes 21 to 23 and the probes 31 to 33. The holddown block 4 is an insulating block which is provided on the lower face of the holddown base 2 and arranged to face the probes 51 and 52.

The control device 40 includes the up-and-down driving unit 41, an up-and-down driving unit 42, and a controller 45. The up-and-down driving unit 41 drives the movable base 24 such that the movable base 24 moves in the up-and-down direction. The up-and-down driving unit 42 drives the holddown base 2 such that the holddown base 2 moves in the up-and-down direction. In driving by the up-and-down driving unit 41 and the up-and-down driving unit 42, an electric cylinder by means of a solenoid mechanism is used, for example. The controller 45 controls the up-and-down driving unit 41 and the up-and-down driving unit 42. This controlling is carried out by use of electrical signals, for example. The controlling by the controller 45 may be achieved by causing a computer to execute by use of predetermined computer software (program) or may be achieved by use of dedicated hardware, for example. According to the configuration described above, the control device 40 moves the movable base 24 (i.e., the dynamic characteristics test probe unit 20) in the up-and-down direction by controlling the up-and-down driving unit 41. In addition, the control device 40 moves the holddown base 2 and the holddown blocks 3 and 4 in the up-and-down direction by controlling the up-and-down driving unit 42.

In the inspection device 101, in an initial state that the controlling by the control device 40 is not carried out (i.e., in a state before the controlling by the control device 40 is started), the tip ends of the probes 21 to 23, the tip ends of the probes 31 to the probe 33, and the tip ends of the probes 51 and 52 are positioned at the same height.

Figure 6:
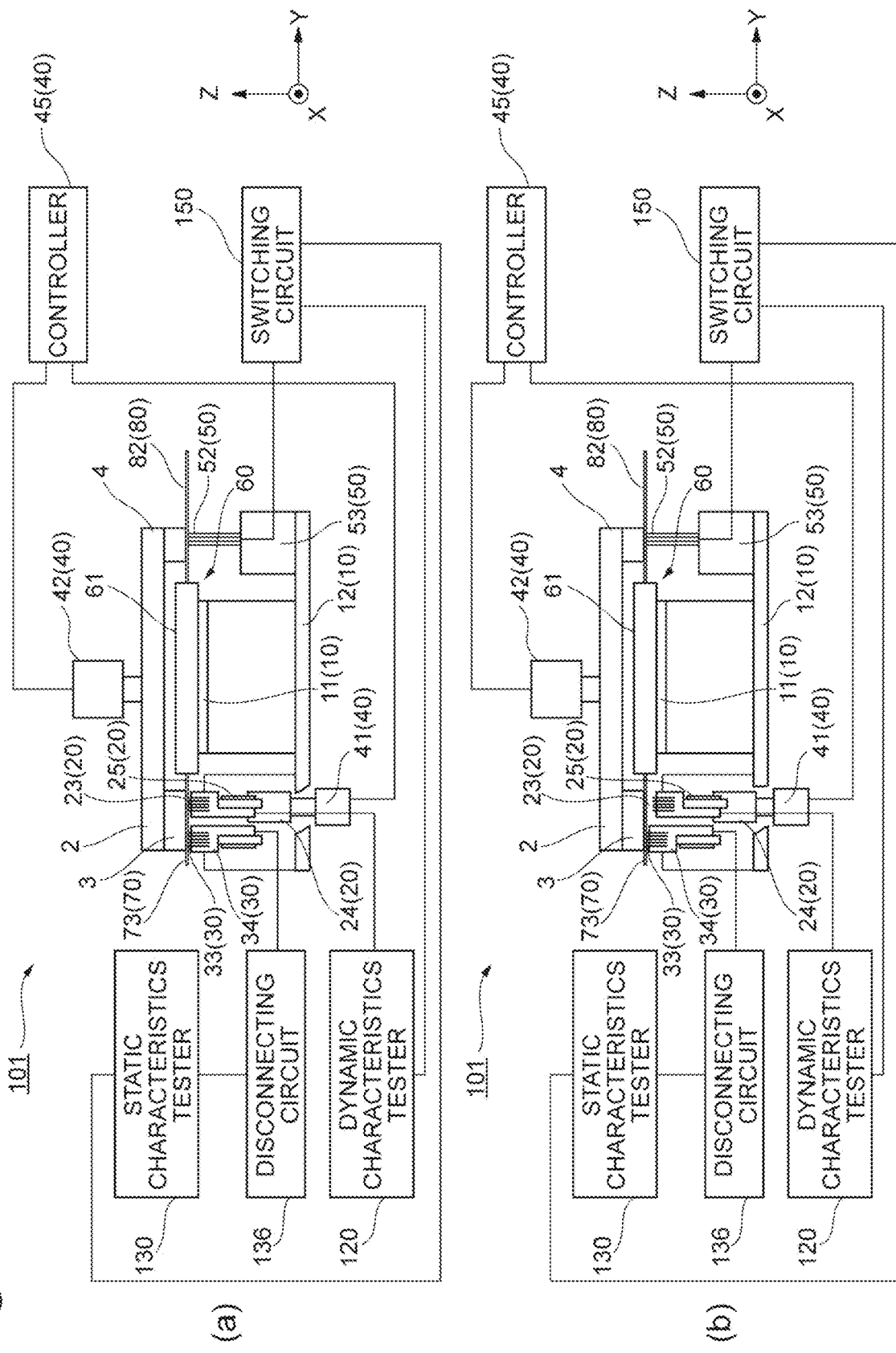
FIG. 6 is a diagram illustrating an operation example of the inspection device according to the first embodiment.

FIG. 6 is a diagram illustrating an operation example of the inspection device 101. As shown in (a) of FIG. 6, the controller 45 moves the holddown base 2 downward by controlling the up-and-down driving unit 42 in a state that the DUT 60 is placed on the stage 11. By doing so, the holddown blocks 3 and 4 presses the electrodes 70 and 80 of the DUT 60 downward. Since the probes 31 to 33 are arranged so as to be in contact with the electrode 70 in a state that the DUT 60 is placed on the stage 11, the probes 31 to 33 are brought into contact with the electrode 70 of the DUT 60 from the lower part of the DUT 60. Additionally, since the probes 51 and 52 are arranged so as to be in contact with the electrode 80 in a state that the DUT 60 is placed on the stage 11, the probes 51 and 52 are brought into contact with the electrode 80 of the DUT 60 from the lower part of the DUT 60.

At this time, the controller 45 brings the probes 21 to 23 into contact with the electrode 70 of the DUT 60 from the lower part of the DUT 60 by controlling the up-and-down driving unit 41. In this way, the control device 40 sets a contact state among the probes 21 to 23, the probes 31 to 33, and the electrode 70 into the dynamic characteristics test state. In this dynamic characteristics test state, the dynamic characteristics test is performed by the dynamic characteristics tester 120 (dynamic characteristics test step). While the dynamic characteristics test is performed, the probes 31 to 33 are electrically disconnected from the static characteristics tester 130 by the disconnecting circuit 136.

Subsequently, as shown in (b) of FIG. 6, the controller 45 moves the movable base 24 and the probes 21 to 23 downward by controlling the up-and-down driving unit 41 to separate the probes 21 to 23 from the electrode 70 of the DUT 60. In this way, the control device 40 sets the contact state among the probes 21 to 23, the probes 31 to 33, and the electrode 70 into the static characteristics test state. In this static characteristics test state, the static characteristics test is performed by the static characteristics tester 130 (static characteristics test step). While the static characteristics test is performed, the separation by the disconnecting circuit 136 is not carried out, and the probes 31 to 33 are electrically connected with the static characteristics tester 130.

In the inspection device 101 described hereinabove, the probes 21 to 23 and the probes 31 to 33 are arranged in such a way as to be brought into contact with the electrode 70 from the lower part of the DUT 60. Then, the controller 45, by moving the probes 21 to 23 in the up-and-down direction by the up-and-down driving unit 41, switches the contact state among the probes 21 to 23, the probes 31 to 33, and the electrode 70 between the dynamic characteristics test state (a state that the probes 21 to 23 are in contact with the electrode 70 or a state that all of the probes 21 to 23 and the probes 31 to 33 are in contact with the electrode 70) and the static characteristics test state (a state that the probes 31 to 33 are in contact with the electrode 70 while the probes 21 to 23 are separated from the electrode 70).

According to the inspection device 101, the dynamic characteristics test is performed by the dynamic characteristics tester 120 in a state that the probes 21 to 23 are in contact with the electrode 70 of the DUT 60. In addition, the static characteristics test is performed by the static characteristics tester 130 in a state that the probes 31 to 33 are in contact with the electrode 70 of the DUT 60. For this reason, each tester can be electrically connected with a device under test with smaller inductance component as compared with a configuration as in related art in which each tester is connected with an electrode of a device under test via an intermediate electrode, for example. As a result, it is possible to improve measurement accuracy of the dynamic characteristics test which is particularly prone to be affected by the inductance component. Further, according to the inspection device 101, while the static characteristics test is performed, the probes 21 to 23 are separate from the electrode 70 of the DUT 60. For example, it may be also considered to, instead of the probes 21 to 23 being separated from the electrode 70 of the DUT 60, provide a relay between the probes 21 to 23 and the dynamic characteristics tester 120 to electrically disconnect the dynamic characteristics tester 120. However, in this case, the measurement accuracy of the dynamic characteristics test is decreased by being affected by the inductance component of the relay. By physically separating the probes 21 to 23 from the electrode 70 of the DUT 60 as in the inspection device 101, a configuration can be obtained in which a relay is not provided between the probes 21 to 23 and the dynamic characteristics tester 120, preventing the measurement accuracy of the dynamic characteristics test from decreasing caused by the inductance component of the relay. Therefore, according to the inspection device 101, it is possible to improve the inspection accuracy of the DUT 60 such as a power semiconductor module.

Moreover, when the dynamic characteristics test is performed, all of the probes 21 to 23 and the probes 31 to 33 are brought into a state of being in contact with the electrode 70 of the DUT 60. In this case also, the probes 31 to 33 are electrically disconnected from the static characteristics tester 130 by the disconnecting circuit 136. For example, it may be also considered to move the probes 31 to 33 (in the downward direction) to electrically disconnect the static characteristics tester 130 from the electrode 70 of the DUT 60, but in this case, an additional moving mechanism for moving the probes 31 to 33 is required as well as machine design or the like therefor is required. By adopting the configuration as in the inspection device 101 in which the probes 31 to 33 are electrically disconnected from the static characteristics tester 130 by the disconnecting circuit 136, such a moving mechanism and machine design may be unnecessary. Note that the inductance component may be generated by providing the disconnecting circuit 136, for example, but this scarcely affects the static characteristics test. This is because, as previously described, the static characteristics test is less affected by the inductance component as compared with the dynamic characteristics test for carrying out the measurement of a very short time change such as a switching time of the transistor, since the static characteristics test is a test for carrying out measurement of the ON-voltages of the transistor and diode or the like.

Further, in the inspection device 101, the probes 21 to 23, the probes 31 to 33, and the probes 51 and 52 are arranged in such a way as to be brought into contact with the electrodes 70 and 80 from the lower part of the DUT 60. For this reason, according to the inspection device 101, the elements included in the inspection device 101 such as the probes 21 to 23, the probes 31 to 33, the probes 51 and 52, the disconnecting circuit 136 and the switching circuit 150 can be collectively arranged at downward portions of the inspection device 101 (e.g., portions on a side lower than the stage 11). This allows the inspection device 101 to be made compact. Moreover, it is also possible to shorten wiring for connecting the respective elements.

Second Embodiment

Figure 7:
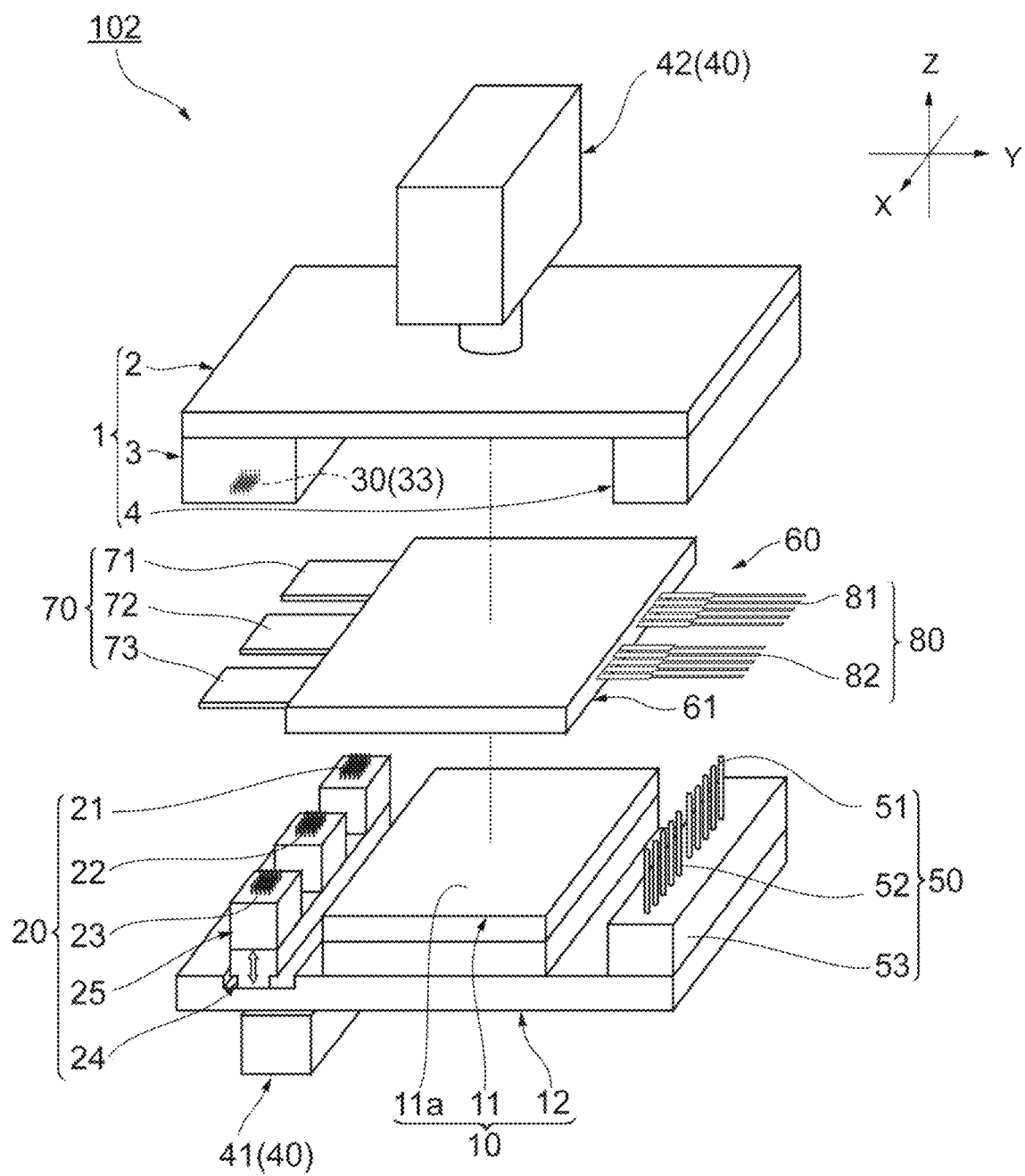
FIG. 7 is a perspective view showing a schematic configuration of an inspection device according to a second embodiment.
Figure 8:
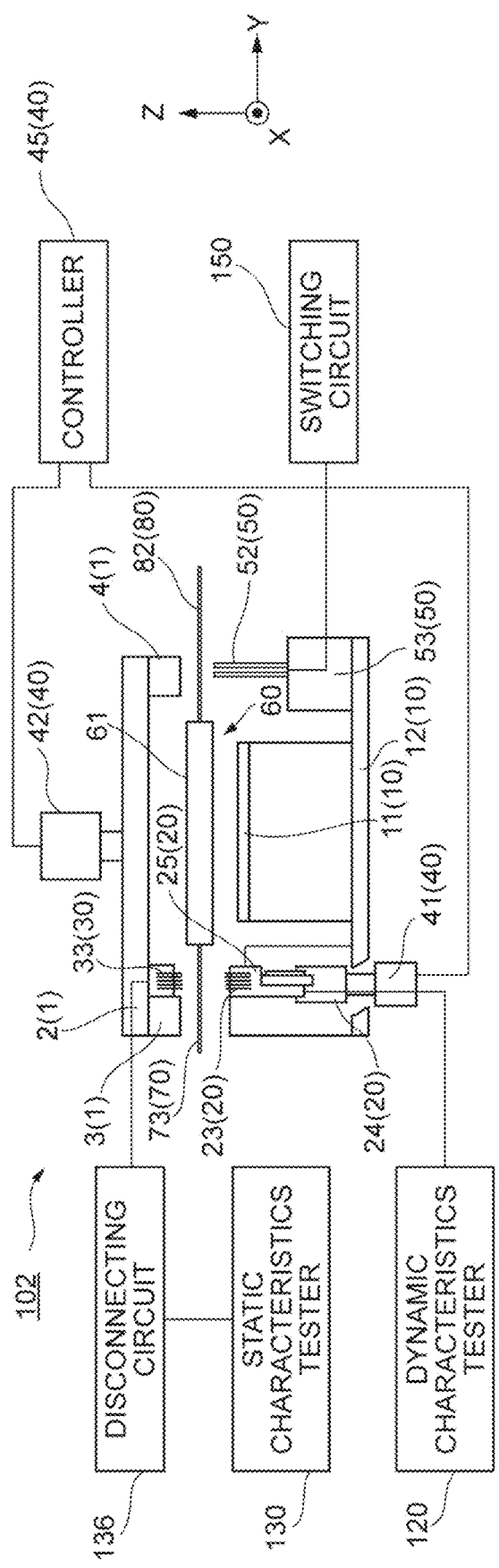
FIG. 8 is a front view of the inspection device according to the second embodiment.

FIG. 7 is a perspective view showing a schematic configuration of an inspection device 102 according to a second embodiment. FIG. 8 is a front view of the inspection device 102. The inspection device 102 is different, as compared with the inspection device 101, particularly in the positions where the probes 31 to 33 are provided and content controlled by the control device 40.

In the inspection device 102, the probes 31 to 33 are arranged in such a way as to be brought into contact with the electrode 70 of the DUT 60 from an upper part of the DUT 60. Specifically, the probes 31 to 33 are housed in a probe holder not shown provided on the holddown block 3. The probes 31 to 33 are housed in the relevant probe holder in such a way as that the tip end portions of the probes 31 to 33 downwardly protrude from the relevant probe holder. The probes 31 to 33 each face the probes 21 to 23, respectively. The probes 31 to 33 each are positioned at upward sides of the P-pole electrode 71, the output electrode 72, and the N-pole electrode 73, respectively, of the DUT 60 in a state that the DUT 60 is placed on the stage 11.

In the inspection device 102, the control device 40, by moving the probes 21 to 23 and the probes 31 to 33 in the up-and-down direction, switches the contact state among the probes 21 to 23, the probes 31 to 33, and the electrode 70 between the dynamic characteristics test state and the static characteristics test state.

In the inspection device 102, in an initial state, the tip ends of the probes 21 to 23 and the tip ends of the probes 51 and 52 are positioned at the same height.

Figure 9:
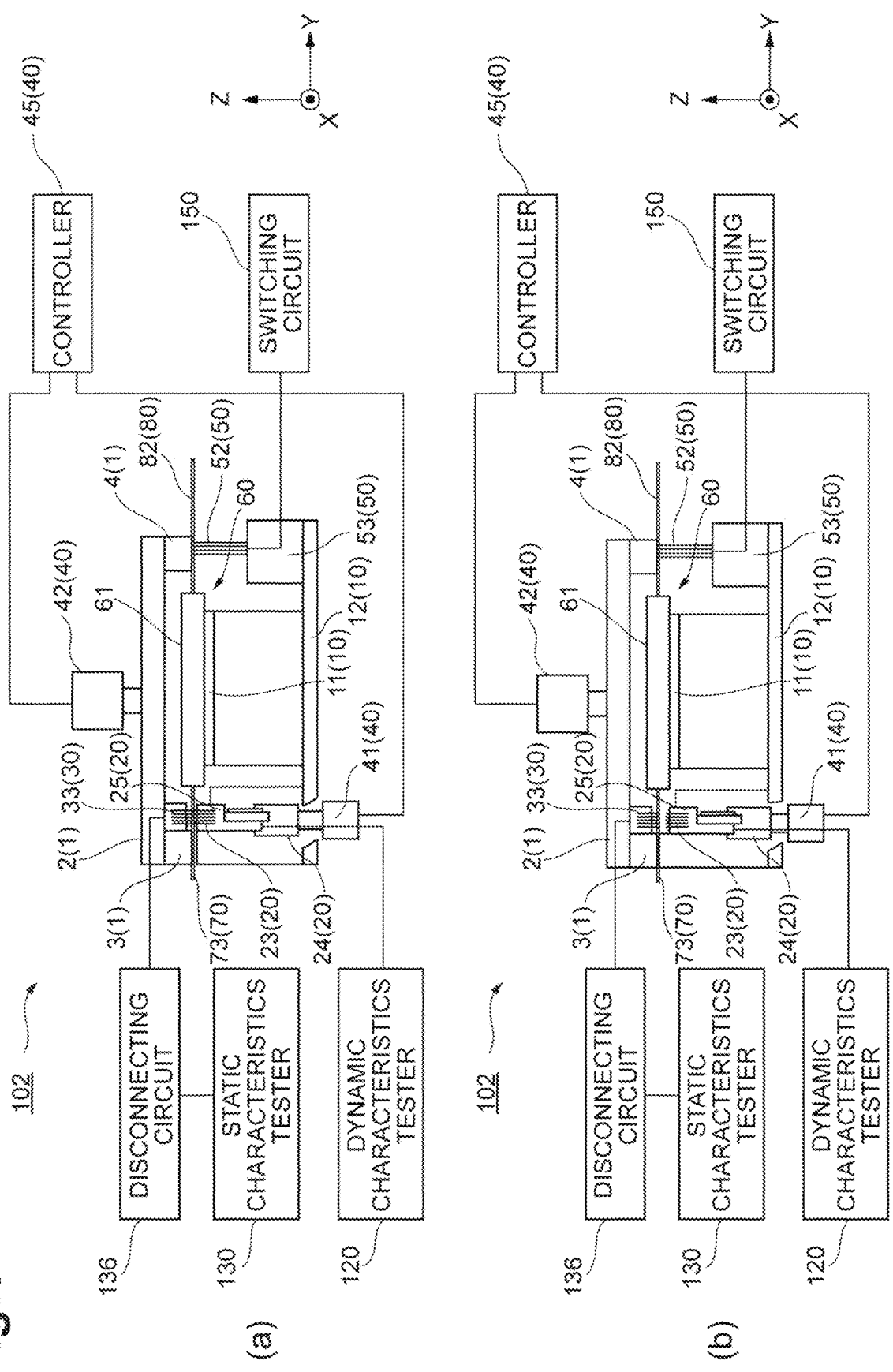
FIG. 9 is a diagram illustrating an operation example of the inspection device according to the second embodiment.

FIG. 9 is a diagram illustrating an operation example of the inspection device 102. As shown in (a) of FIG. 9, the controller 45 moves the holddown base 2 downward by controlling the up-and-down driving unit 42 in a state that the DUT 60 is placed on the stage 11. By doing so, the probes 31 to 33 are brought into contact with the electrode 70 of the DUT 60 from the upper part of the DUT 60. Additionally, the probes 21 to 23 are brought into contact with the electrode 70 of the DUT 60 from the lower part of the DUT 60, and the probes 51 and 52 are brought into contact with the electrode 80 of the DUT 60 from the lower part of the DUT 60. In this way, the control device 40 sets the contact state among the probes 21 to 23, the probes 31 to 33, and the electrode 70 into the dynamic characteristics test state. In this dynamic characteristics test state, the dynamic characteristics test is performed by the dynamic characteristics tester 120 (dynamic characteristics test step). While the dynamic characteristics test is performed, the probes 31 to 33 are electrically disconnected from the static characteristics tester 130 by the disconnecting circuit 136.

Subsequently, as shown in (b) of FIG. 9, the control device 40 moves the movable base 24 and the probes 21 to 23 downward by controlling the up-and-down driving unit 41 to separate the probes 21 to 23 from the electrode 70 of the DUT 60. By doing so, the control device 40 sets the contact state among the probes 21 to 23, the probes 31 to 33, and the electrode 70 into the static characteristics test state. In this static characteristics test state, the static characteristics test is performed by the static characteristics tester 130 (static characteristics test step). While the static characteristics test is performed, the separation by the disconnecting circuit 136 is not carried out, and the probes 31 to 33 are electrically connected with the static characteristics tester 130.

According to also the operation of the inspection device 102 like this, the positional control is carried out by the control device 40 to switch the contact state among the probes 21 to 23, the probes 31 to 33, and the electrode 70 of the DUT 60 between the dynamic characteristics test state and the static characteristics test state, similarly to the inspection device 101. Accordingly, it is possible to improve the inspection accuracy of the DUT 60. Moreover, according to the inspection device 102, the probes 21 to 23 are brought into contact with the lower face of the electrode 70 and the probes 31 to 33 are brought into contact with an upper face of the electrode 70. This makes it possible to perform the inspection on the DUT 60 by bring the probes 21 to 23 and the probes 31 to 33 respectively into contact with both faces of the electrode 70 even in a case where, for example, it is difficult to bring all of the probes 21 to 23 and the probes 31 to 33 into contact with only one face of the electrode 70 because an area of the electrode 70 is small.

Third Embodiment

Figure 10:
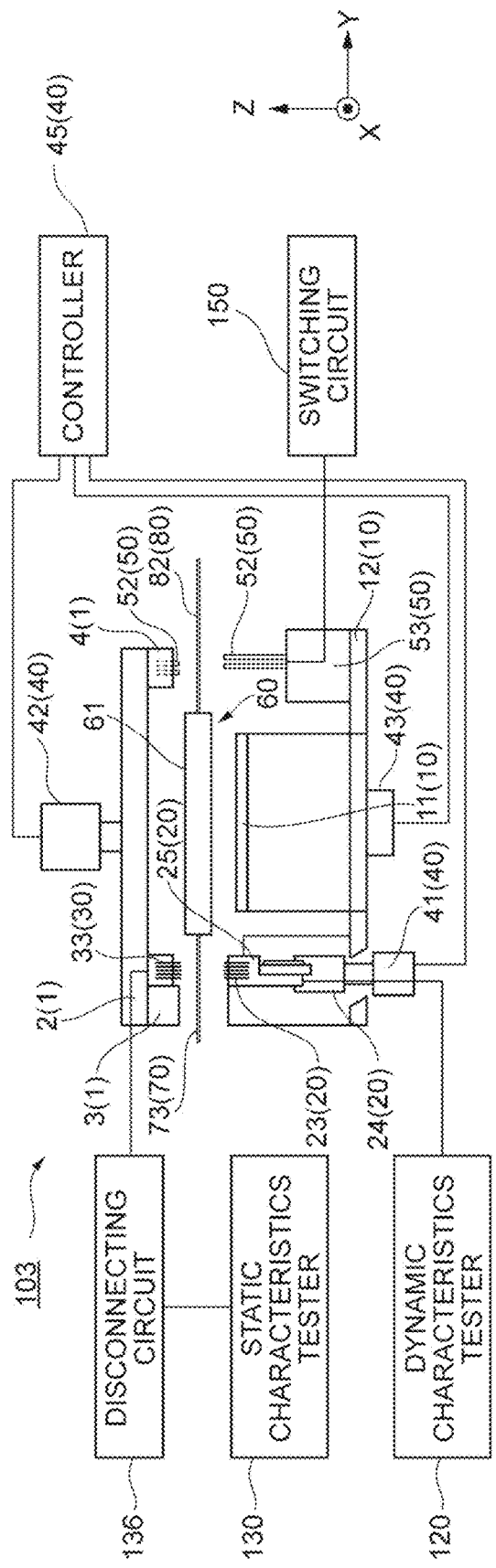
FIG. 10 is a front view of an inspection device according to a third embodiment.

FIG. 10 is a front view of an inspection device 103 according to a third embodiment. The inspection device 103 is different, as compared with the inspection device 102, particularly in that the control device 40 includes an up-and-down driving unit 43, and in the positions where the probes 51 and 52 are provided and content controlled by the control device 40. Note that in the inspection device 103, the control device 40 may not necessarily include the up-and-down driving units 41 and 42.

The up-and-down driving unit 43 drives the insulating base 12 such that the insulating base 12 moves in the up-and-down direction. The up-and-down driving unit 43 is controlled by the controller 45 similarly to the up-and-down driving units 41 and 42.

In the inspection device 103, the probes 51 and 52 (here, the probe 51 are not shown in FIG. 10 that is a front view) are arranged in such a way as to be brought into contact also with the electrode 70 of the DUT 60 from the upper part of the DUT 60. Specifically, the probes 51 and 52 are housed in a probe holder not shown provided on the holddown block 4. The probes 51 and 52 are housed in the relevant probe holder in such a way as that the tip end portions of the probes 51 and 52 downwardly protrude from the relevant probe holder. These probe 51 and probe 52 provided on the holddown block 4 side each face the probes 51 and 52, respectively, provided on the insulating base 12 side. The probes 51 and 52 provided on the holddown block 4 side each are positioned at the upward sides of the control electrodes 81 and 82 of the DUT 60 in a state that the DUT 60 is placed on the stage 11.

In the inspection device 103, the control device 40, by moving the stage 11 in the up-and-down direction, switches the contact state among the probes 21 to 23, the probes 31 to 33, and the electrode 70 between the dynamic characteristics test state and the static characteristics test state.

In the inspection device 103, in an initial state, the tip ends of the probes 21 to 23 and the tip ends of the probes 51 and 52 on the insulating base 12 side are positioned at the same height. Additionally, the tip ends of the probes 31 to 33 and the tip ends of the probes 51 and 52 on the holddown block 4 side are positioned at the same height.

Figure 11:
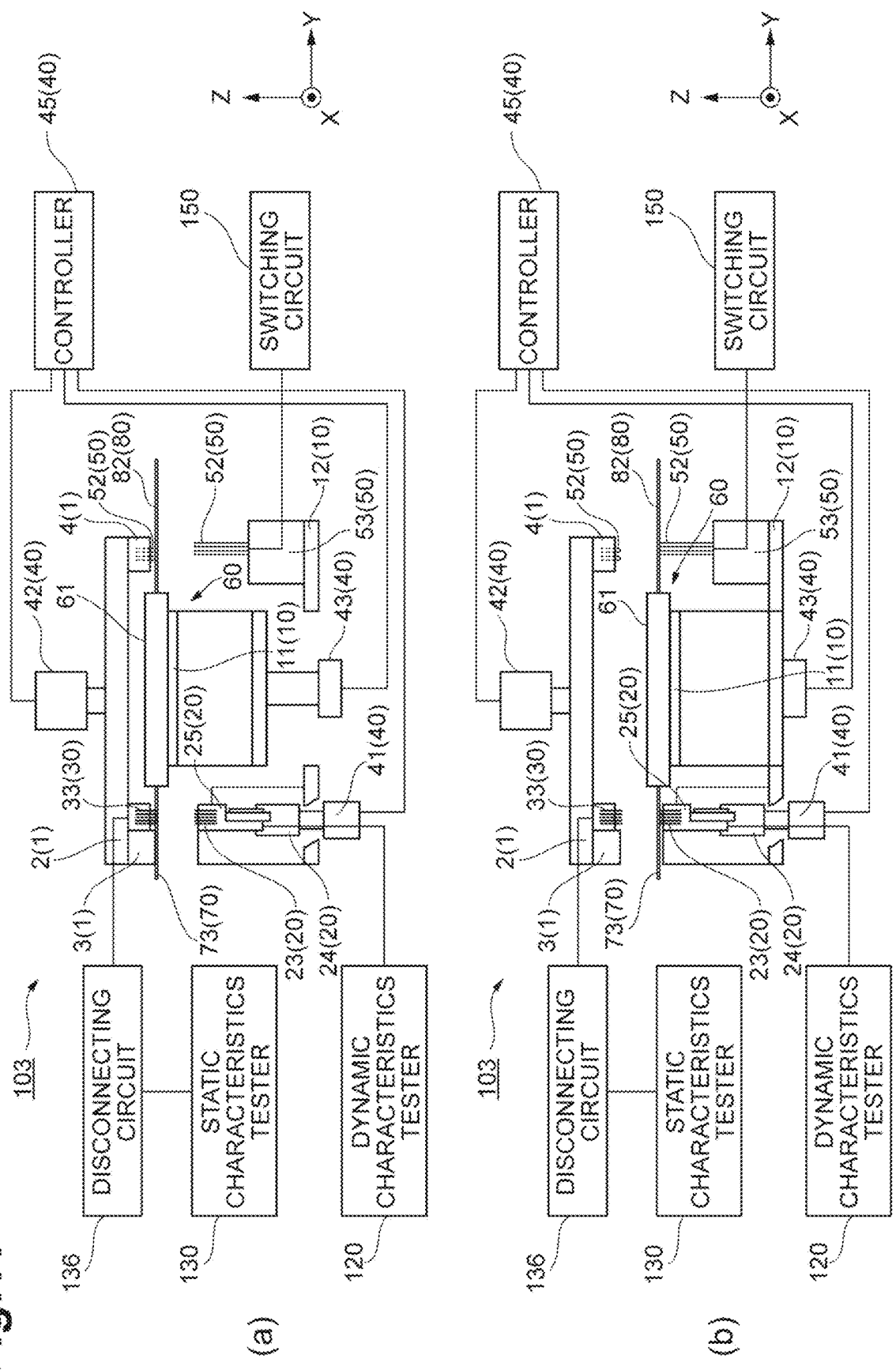
FIG. 11 is a diagram illustrating an operation example of the inspection device according to the third embodiment.

FIG. 11 is a diagram illustrating an operation example of the inspection device 103. As shown in (a) of FIG. 11, the controller 45 moves the insulating base 12 upward by controlling the up-and-down driving unit 43 in a state that the DUT 60 is placed on the stage 11. By doing so, the probes 31 to 33 are brought into contact with the electrode 70 of the DUT 60 from the upper part of the DUT 60. Moreover, the probes 51 and 52 provided on the holddown block 4 side are brought into contact with the electrode 80 of the DUT 60 from the upper part of the DUT 60. In this way, the control device 40 sets the contact state among the probes 21 to 23, the probes 31 to 33, and the electrode 70 into the static characteristics test state. In this static characteristics test state, the static characteristics test is performed by the static characteristics tester 130 (static characteristics test step). While the static characteristics test is performed, the separation by the disconnecting circuit 136 is not carried out, and the probes 31 to 33 are electrically connected with the static characteristics tester 130.

In addition, the controller 45 moves the insulating base 12 downward by controlling the up-and-down driving unit 43. By doing so, the probes 21 to 23 are brought into contact with the electrode 70 of the DUT 60 from the lower part of the DUT 60. Moreover, the probes 51 and 52 provided on the insulating base 12 side are brought into contact with the electrode 70 of the DUT 60 from the lower part of the DUT 60. In this way, the control device 40 sets a contact state among the probes 21 to 23, the probes 31 to 33, and the electrode 70 into the dynamic characteristics test state. In this dynamic characteristics test state, the dynamic characteristics test is performed by the dynamic characteristics tester 120 (dynamic characteristics test step). Note that in the inspection device 103, while the dynamic characteristics test is performed, since the probes 31 to 33 are separated from the electrode 70 of the DUT 60, the probes 31 to 33 is not required to be electrically disconnected from the static characteristics tester 130 by the disconnecting circuit 136. For this reason, the probes 31 to 33 may be electrically connected with the static characteristics tester 130 not via the disconnecting circuit 136, and in this case, the inspection device 103 is configured to not include the disconnecting circuit 136.

According to also the operation of the inspection device 103 like this, the positional control is carried out by the control device 40 to switch the contact state among the probes 21 to 23, the probes 31 to 33, and the electrode 70 of the DUT 60 between the dynamic characteristics test state and the static characteristics test state, similarly to the inspection device 101. Accordingly, it is possible to improve the inspection accuracy of the DUT 60. Additionally, it is possible to perform the inspection on the DUT 60 by bring the probes 21 to 23 and the probes 31 to 33 into contact with both faces of the electrode 70, similarly to the inspection device 102. Further, according to the inspection device 103, since it is not indispensable to move the probes 21 to 23, the probes 31 to 33, and the probes 51 and 52, the up-and-down driving units 41 and 42 may be unnecessary.

Fourth Embodiment

Figure 12:
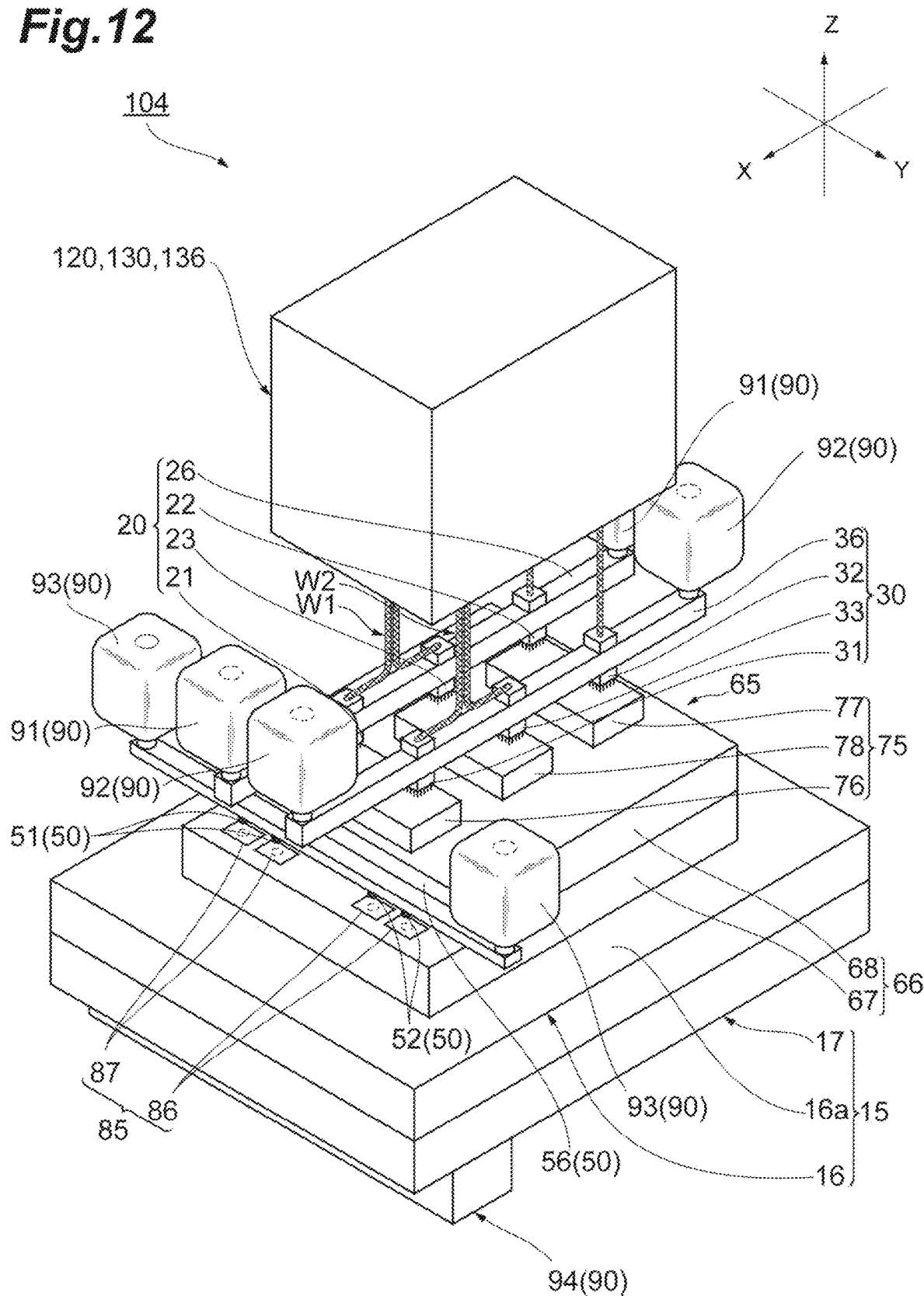
FIG. 12 is a perspective view showing a schematic configuration of an inspection device according to a fourth embodiment.
Figure 13:
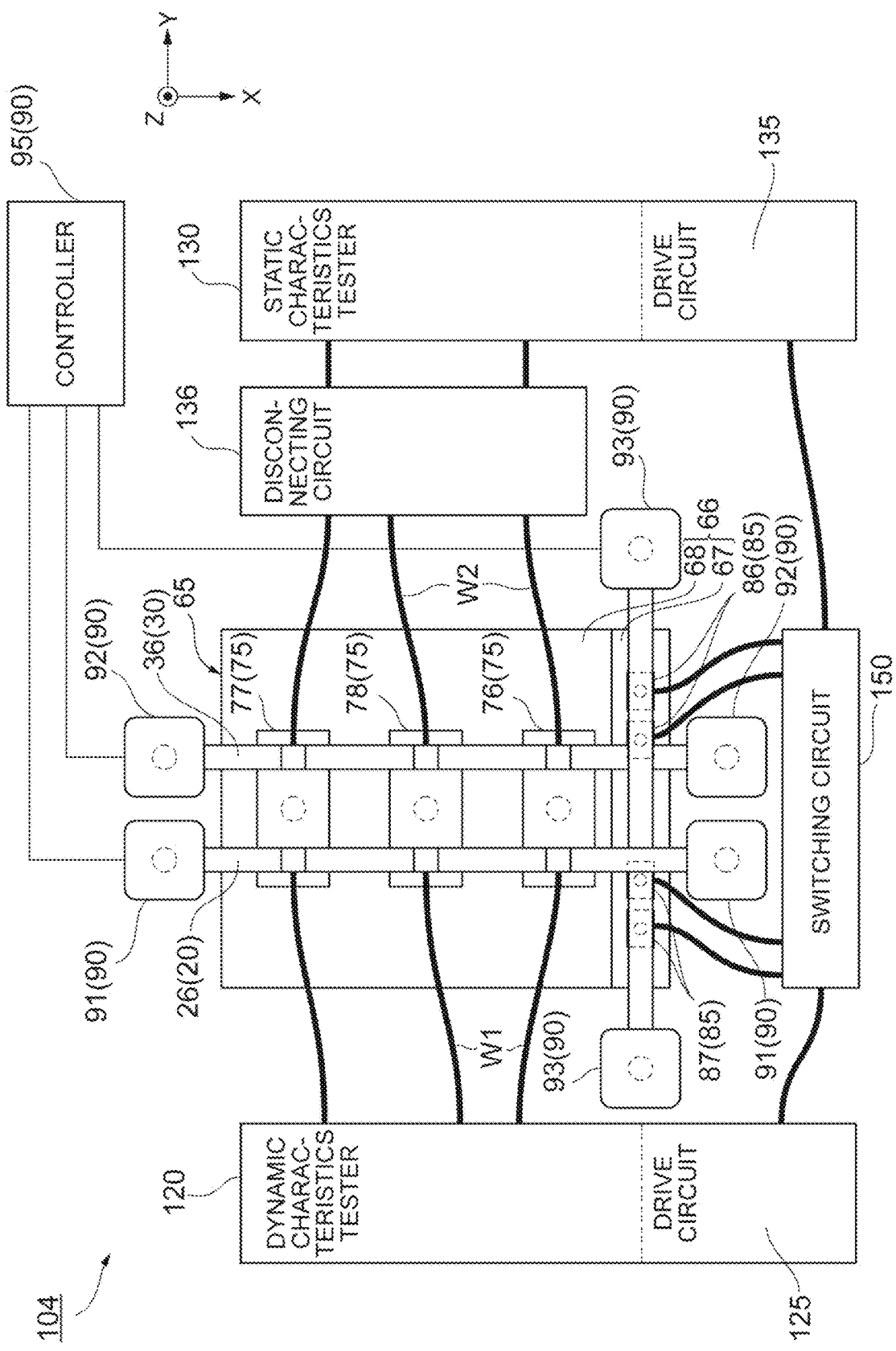
FIG. 13 is a plan view of the inspection device according to the fourth embodiment.
Figure 14:
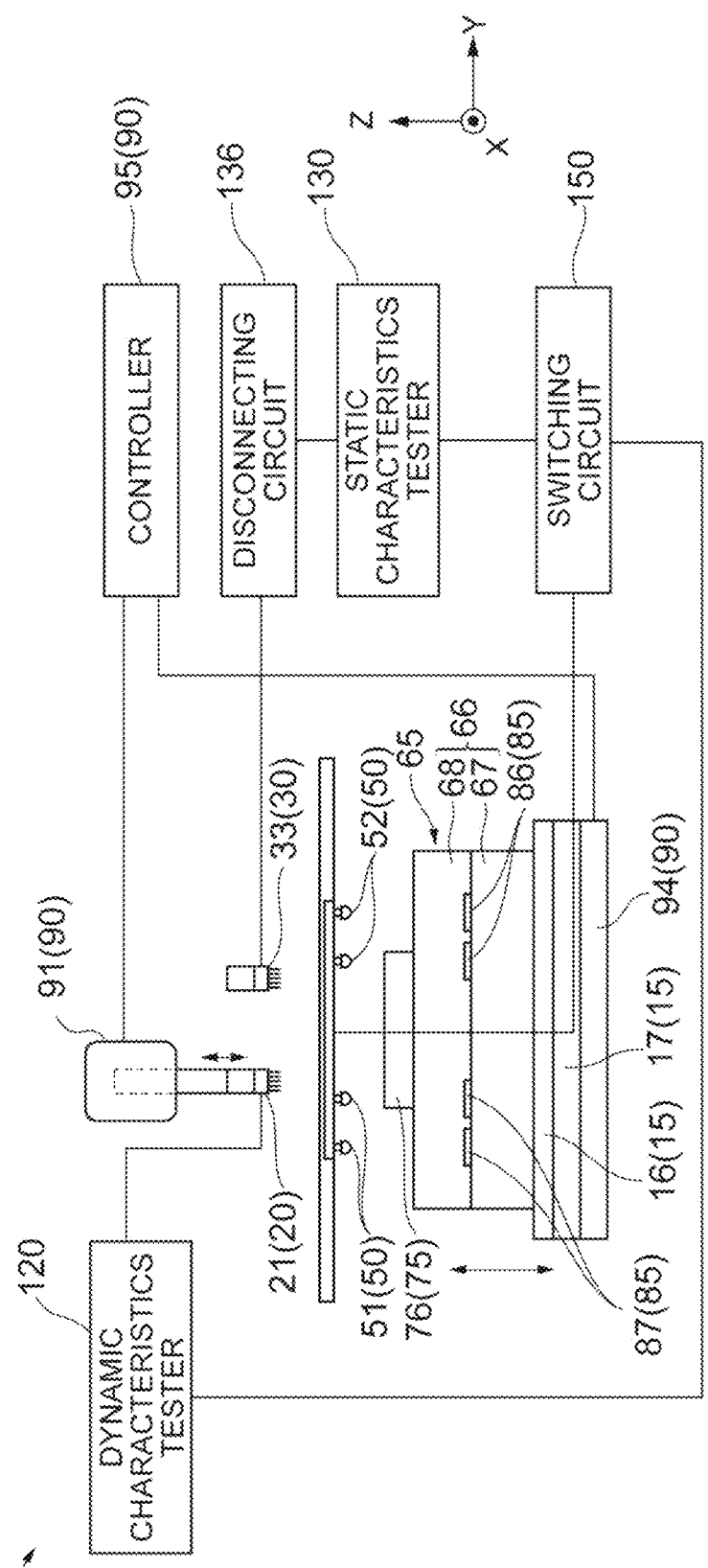
FIG. 14 is a front view of the inspection device according to the fourth embodiment.

FIG. 12 is a perspective view showing a schematic configuration of an inspection device 104 according to a fourth embodiment. FIG. 13 is a plan view of the inspection device 104. FIG. 14 is a front view of the inspection device 104. The inspection device 104 performs the inspection of a DUT 65. The DUT 65 has a function the same as the DUT 60, but has a shape different from the DUT 60.

The DUT 65 includes a main body 66, and electrode 75, and an electrode 85. The main body 66 includes the transistors Q1 and Q2 and the diodes D1 and D2 (in FIG. 3). The main body 66 has a first section 67 and a second section 68. The first section 67 and the second section 68 both have a plate shape. The second section 68, when viewed in the XY plane, has an area smaller than the first section 67.

The second section 68 is provided onto the first section 67. The electrode 75 consists of a P-pole electrode 76, an output electrode 77, and an N-pole electrode 78. The P-pole electrode 76, the output electrode 77, and the N-pole electrode 78 are provided onto the second section 68. These electrodes are arranged on an upper face of the second section 68 along the X-axis positive direction in an order of the output electrode 77, the N-pole electrode 78, and the P-pole electrode 76. Intended use for the P-pole electrode 76, the output electrode 77, and the N-pole electrode 78 is the same as for the P-pole electrode 71, the output electrode 72, and the N-pole electrode 73, and thus, the description thereof is omitted here. The electrode 85 consists of control electrodes 86 and 87. The control electrodes 86 and 87 are provided onto a portion of the first section 67 where the second section 68 is not provided. These electrodes are arranged on an upper face of the first section 67 along the Y-axis positive direction in an order of the control electrodes 87 and the control electrodes 86. Intended use for the control electrodes 86 and the control electrodes 87 is the same as for the control electrodes 81 and the control electrodes 82, and thus, the description thereof is omitted here.

The inspection device 104 also includes the probes 21 to 23, the probes 31 to 33, and the probes 51 and 52 similarly to the inspection device 101. However, a specific configuration of the probes 21 to 23 and probes 31 to 33 in the inspection device 104 is adequately changed in order to perform the inspection on the DUT 65. Moreover, in the inspection device 104, the dynamic characteristics test probe unit 20 includes a supporting bar 26 extending in the X-axis direction. In the dynamic characteristics test probe unit 20, the probes 21 to 23 are fixed to the supporting bar 26 in such a way as that the tip end portions thereof extend from the supporting bar 26 toward the downward side. The probe 21 to the probe 23 each are positioned at upward sides of the P-pole electrode 76, the output electrode 77, and the N-pole electrode 78, respectively, of the DUT 65 in a state that the DUT 65 is placed on a stage 16. The static characteristics test probe unit 30 includes a supporting bar 36 extending in the X-axis direction. The supporting bar 36 is positioned at the same height as the supporting bar 26 and is aligned with the supporting bar 26 side by side in the Y-axis direction. In the static characteristics test probe unit 30, the probes 31 to 33 are fixed to the supporting bar 36 in such a way as that the tip end portions thereof extend from the supporting bar 36 toward the downward side. The probes 31 to 33 each are positioned at the upward sides of the P-pole electrode 76, the output electrode 77, and the N-pole electrode 78, respectively, of the DUT 65 in a state that the DUT 65 is placed on the stage 16. The probe unit 50 includes a supporting bar 56 extending in the Y-axis direction. In the probe unit 50, the probes 51 and 52 are fixed to the supporting bar 56 in such a way as that the tip end portions thereof extend from the supporting bar 56 toward the downward side. The probes 51 and 52 each are positioned at upward sides of the control electrodes 87 and 86, respectively, of the DUT 65 in a state that the DUT 65 is placed on the stage 16.

Note that in FIG. 12, the dynamic characteristics tester 120, the static characteristics tester 130, and the disconnecting circuit 136 are arranged as one unit on an upward side. However, the respective elements may be separately arranged. In the inspection device 104, a wiring W1 connecting the probe 21 and the probe 23 with the dynamic characteristics tester 120 (i.e., a wiring connecting the P-pole electrode 76 and the N-pole electrode 78 with the dynamic characteristics tester 120) is configured as parallel plates formed of flat braid conducting wire interposing an insulator. The insulator is insulating paper or an insulation heat shrinkable tube, for example. In this case, since the currents opposite to each other flow in the respective plates of the parallel plates, a wiring inductance can be reduced. Further, flexibility of the wiring W1 can be attained also. The same configuration as the wiring W1 may be applied to a wiring W2 connecting the probe 31 and the probe 33 with the static characteristics tester 130 (more specifically, the disconnecting circuit 136).

The inspection device 104 is different, as compared with the inspection device 101, particularly in that it includes a pedestal unit 15 instead of the pedestal unit 10 and includes a control device 90 instead of the control device 40.

The pedestal unit 15 includes the stage 16 and an insulating base 17. The stage 16 is an insulated stage provided on the insulating base 17. The DUT 65 is placed on the stage 16. The stage 16 has a pedestal face 16a. The pedestal face 16a supports the main body 66 (first section 67) of the DUT 65. When the DUT 65 is planarly viewed, the main body 66 of the DUT 65 is positioned inside the pedestal face 16a.

The control device 90 includes up-and-down driving units 91 to 94, and a controller 95. The up-and-down driving unit 91 is a pair of driving units which are connected with both ends of the supporting bar 26 and drive the supporting bar 26 such that the supporting bar 26 moves in the up-and-down direction. The up-and-down driving unit 92 is a pair of driving units which are connected with both ends of the supporting bar 36 and drive the supporting bar 36 such that the supporting bar 36 moves in the up-and-down direction. The up-and-down driving unit 93 is a pair of driving units which are connected with both ends of the supporting bar 56 and drive the supporting bar 56 such that the supporting bar 56 moves in the up-and-down direction. The up-and-down driving unit 94 drives the insulating base 17 such that the insulating base 17 moves in the up-and-down direction. In driving by the up-and-down driving units 91 to 94, an electric cylinder by means of a solenoid mechanism is used, for example. The controller 95 controls the up-and-down driving units 91 to 94. According to the configuration described above, the controller 95 moves the supporting bar 26 (i.e., the probes 21 to 23) in the up-and-down direction by controlling the up-and-down driving unit 91. In addition, the controller 95 moves the supporting bar 36 (i.e., the probes 31 to 33) in the up-and-down direction by controlling the up-and-down driving unit 92. Moreover, the controller 95 moves the supporting bar 56 (i.e., the probes 51 and 52)

in the up-and-down direction by controlling the up-and-down driving unit 93. Further, the controller 95 moves the insulating base 17 and the stage 16 in the up-and-down direction by controlling the up-and-down driving unit 94.

Note that in the inspection device 104, it is not necessary to use all of the up-and-down driving units 91 to 94 described above. In an exemplary operation of the inspection device 104 described later, the up-and-down driving unit 91 and the up-and-down driving unit 94 are used. For this reason, only the up-and-down driving units 91 and 94 of the up-and-down driving units 91 to 94 are illustrated in FIG. 14 and in FIG. 15 described later.

In the inspection device 104, the probes 21 to 23 and the probes 31 to 33 are arranged in such a way as to be brought into contact with the electrode 75 of the DUT 65 from an upper part of the DUT 65. Then, the control device 90, by moving the stage 16 and the probes 21 to 23 in the up-and-down direction, switches the contact state among the probes 21 to 23, the probes 31 to 33, and the electrode 75 between the dynamic characteristics test state and the static characteristics test state. The dynamic characteristics test state here is a state that the probes 21 to 23 each are in contact with the P-pole electrode 76, the output electrode 77, and the N-pole electrode 78, respectively, of the DUT 65. The static characteristics test state here is a state that the probes 31 to 33 each are brought into contact with the P-pole electrode 76, the output electrode 77, and the N-pole electrode 78, respectively, of the DUT 65 while the probes 21 to 23 each are separated from the P-pole electrode 76, the output electrode 77, and the N-pole electrode 78, respectively, of the DUT 65.

In the inspection device 104, in an initial state that the controlling by the control device 90 is not carried out (i.e., in a state before the controlling by the control device 90 is started), the tip ends of the probes 21 to 23 and the tip ends of the probes 31 to 33 are positioned at the same height. The tip ends of the probes 51 and 52 are positioned lower than the tip ends of the probes 21 to 23 and the tip ends of the probes 31 to 33. A distance in a height direction between the tip ends of the probes 21 to 23 and probes 31 to 33 and the tip ends of the probes 51 and 52 is substantially equal to a distance in the height direction (Z-axis direction) between a surface of the electrode 75 and a surface of the electrode 85.

Figure 15:
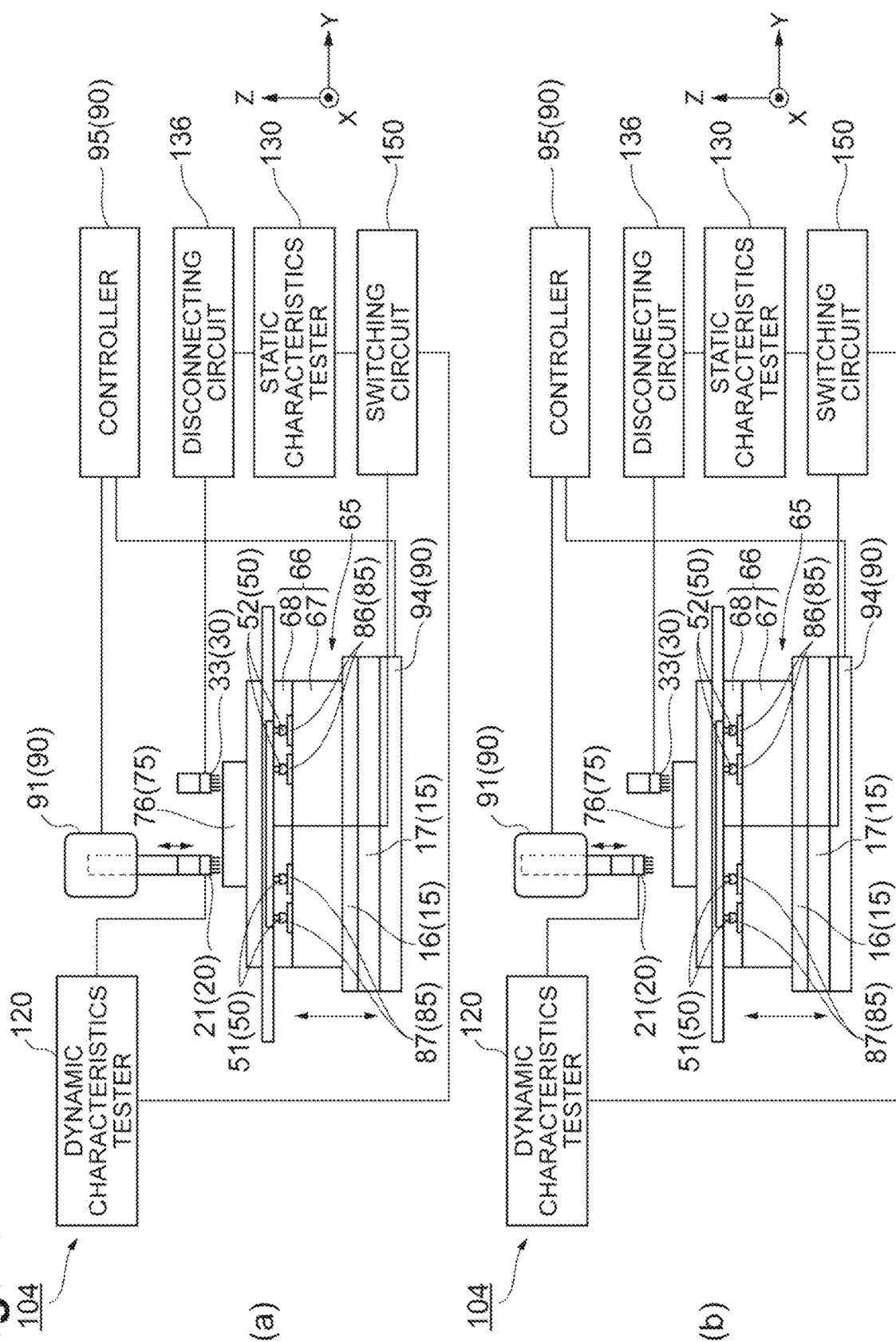
FIG. 15 is a diagram illustrating an operation example of the inspection device according to the fourth embodiment.

FIG. 15 is a diagram illustrating an operation example of the inspection device 104. As shown in (a) of FIG. 15, the controller 95 moves the stage 16 upward by controlling the up-and-down driving unit 94 in a state that the DUT 65 is placed on the stage 16. By doing so, the probes 21 to 23 and the probes 31 to 33 are brought into contact with the electrode 75 of the DUT 65 from the upper part of the DUT 65. Moreover, the probes 51 and 52 are brought into contact with the electrode 85 of the DUT 65 from the upper part of the DUT 65. In this way, the control device 90 sets a contact state among the probes 21 to 23, the probes 31 to 33, and the electrode 75 into the dynamic characteristics test state. In this dynamic characteristics test state, the dynamic characteristics test is performed by the dynamic characteristics tester 120 (dynamic characteristics test step). While the dynamic characteristics test is performed, the probes 31 to 33 are electrically disconnected from the static characteristics tester 130 by the disconnecting circuit 136.

Subsequently, the controller 95 moves the probes 21 to 23 upward by controlling the up-and-down driving unit 91. By doing so, as shown in (b) of FIG. 15, the probes 21 to 23 are separated from the electrode 75 of the DUT 65. By doing so, the control device 90 sets the contact state among the probes 21 to 23, the probes 31 to 33, and the electrode 75 into the static characteristics test state. In the static characteristics test state, the static characteristics test is performed by the static characteristics tester 130 (static characteristics test step). While the static characteristics test is performed, the separation by the disconnecting circuit 136 is not carried out, and the probes 31 to 33 are electrically connected with the static characteristics tester 130.

According to the inspection device 104, the positional control is carried out by the control device 90 to switch the contact state among the probes 21 to 23, the probes 31 to 33, and the electrode 75 of the DUT 65 between the dynamic characteristics test state and the static characteristics test state. Therefore, according to a principle similar to the inspection device 101, it is possible to improve the inspection accuracy of the DUT 65. Further, according to the inspection device 104, since it is not indispensable to move the probes 31 to 33 and the probes 51 and 52, the up-and-down driving unit 92 and the up-and-down driving unit 93 may be unnecessary.

Fifth Embodiment

Figure 16:
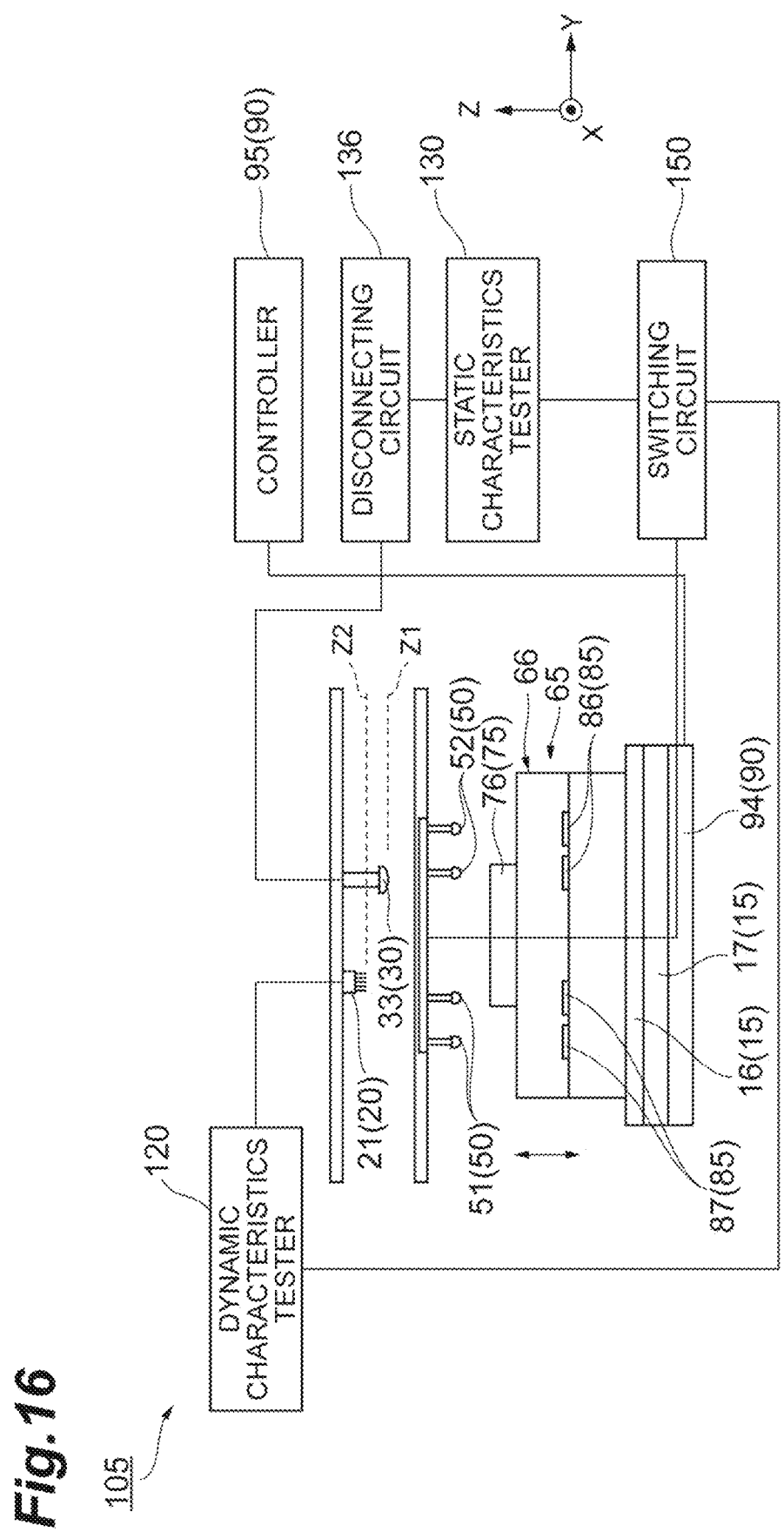
FIG. 16 is a front view of an inspection device according to a fifth embodiment.

FIG. 16 is a front view of an inspection device 105 according to a fifth embodiment. The inspection device 105 is different, as compared with the inspection device 104, particularly in a specific configuration of the probes 31 to 33 and probes 51 and 52, a positional relationship between the probes 21 to 23 and the probes 31 to 33, and content controlled by the control device 90. Note that in an exemplary operation of the inspection device 105 described later, the up-and-down driving unit 94 is used. For this reason, only the up-and-down driving unit 94 of the up-and-down driving units 91 to 94 is illustrated in FIG. 16 and in FIG. 17 described later.

In the inspection device 105, the probes 31 to 33 and the probes 51 and 52 each are a spring probe capable of expansion and contraction in the up-and-down direction. Therefore, the probes 31 to 33 and the probes 51 and 52 each are supported by a spring not shown, for example, to be capable of expansion and contraction in the up-and-down direction by means of expansion and contraction of the relevant spring.

In the inspection device 105, the control device 90, by moving the stage 16 in the up-and-down direction, switches the contact state among the probes 21 to 23, the probes 31 to 33, and the electrode 75 between the dynamic characteristics test state and the static characteristics test state.

In the inspection device 105, in an initial state, a height Z2 at the tip ends of the probes 21 to 23 is positioned upper than a height Z1 at the tip ends of the probes 31 to 33.

Figure 17:
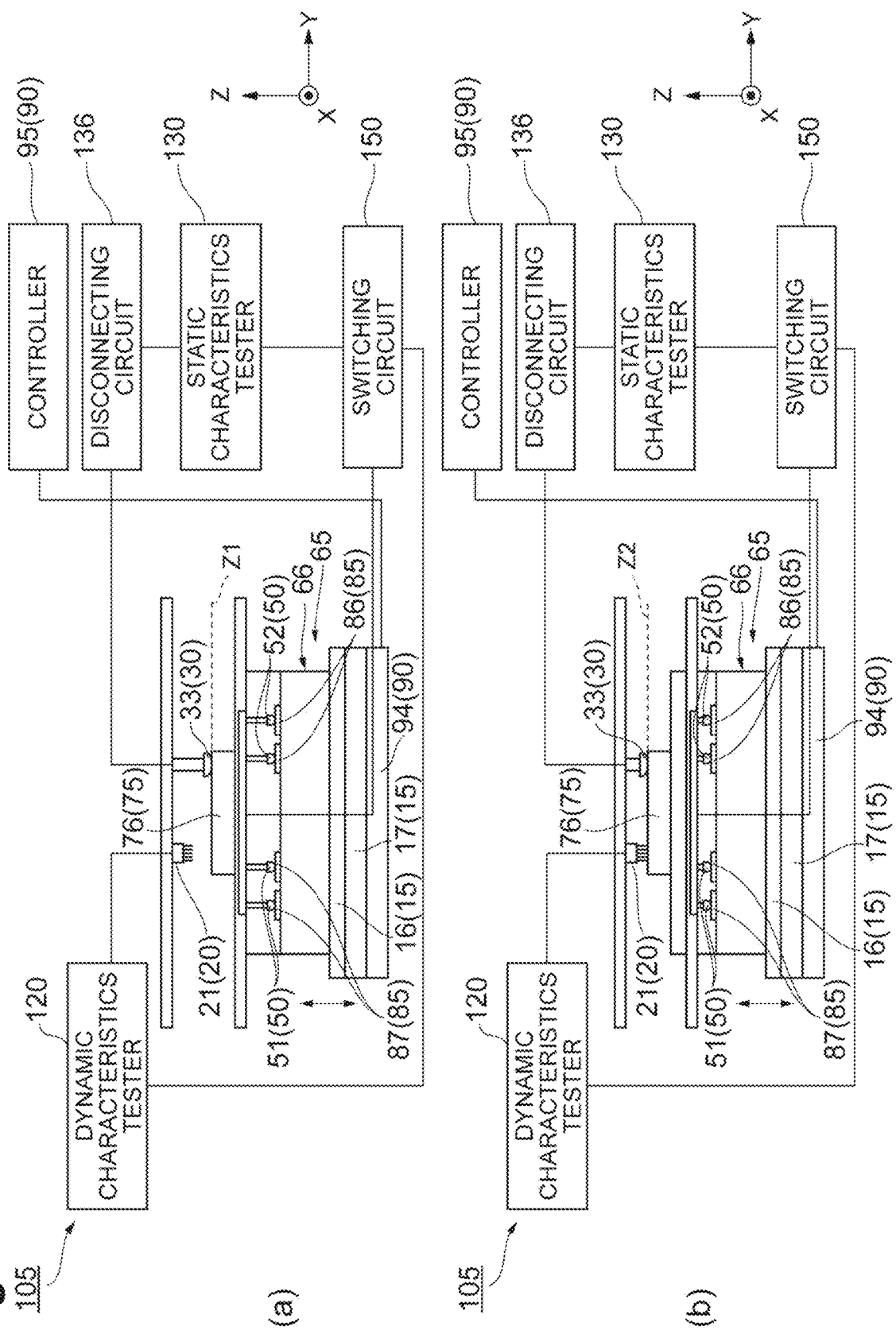
FIG. 17 is a diagram illustrating an operation example of the inspection device according to the fifth embodiment.

FIG. 17 is a diagram illustrating an operation example of the inspection device 105. As shown in (a) of FIG. 17, the controller 95 moves the stage 16 upward by controlling the up-and-down driving unit 94 in a state that the DUT 65 is placed on the stage 16. At this time, the control device 90 moves the stage 16 upward such that a position of a surface of the electrode 75 of the DUT 65 is positioned at the height Z1. By doing so, the tip ends of the probes 31 to 33 abut on the electrode 75 of the DUT 65 and the tip ends of the probes 51 and 52 abut on the electrode 85 of the DUT 65. In other words, the probes 31 to 33 are brought into contact with the electrode 75 of the DUT 65 from the upper part of the DUT 65 while the probes 21 to 23 are separated from the electrode 75 of the DUT 65. Moreover, the probes 51 and 52 are brought into contact with the electrode 85 of the DUT 65 from the upper part of the DUT 65. In this way, the control device 90 sets the contact state among the probes 21 to 23, the probes 31 to 33, and the electrode 75 into the static characteristics test state. In the static characteristics test state, the static characteristics test is performed by the static characteristics tester 130 (static characteristics test step). While the static characteristics test is performed, the separation by the disconnecting circuit 136 is not carried out, and the probes 31 to 33 are electrically connected with the static characteristics tester 130.

Subsequently, as shown in (b) of FIG. 17, the control device 90 moves the stage 16 further upward such that the position of the surface of the electrode 75 of the DUT 65 is positioned at the height Z2. The probes 31 to 33 are pressed and contracted upward by the electrode 75 of the DUT 65, because they are spring type probes. Similarly, the probes 51 and 52 are pressed and contracted upward by the electrode 85 of the DUT 65. In addition, the tip ends of the probes 21 to 23 abut on the electrode 75 of the DUT 65. By doing so, besides the probes 31 to 33, the probes 21 to 23 also are brought into contact with the electrode 75 of the DUT 65 from the upper part of the DUT 65. In this way, the control device 90 sets the contact state among the probes 21 to 23, the probes 31 to 33, and the electrode 75 into the dynamic characteristics test state. In this dynamic characteristics test state, the dynamic characteristics test is performed by the dynamic characteristics tester 120 (dynamic characteristics test step). While the dynamic characteristics test is performed, the probes 31 to 33 are electrically disconnected from the static characteristics tester 130 by the disconnecting circuit 136.

According to also the operation of the inspection device 105 like this, the positional control is carried out by the control device 90 to switch the contact state among the probes 21 to 23, the probes 31 to 33, and the electrode 75 of the DUT 65 between the dynamic characteristics test state and the static characteristics test state, similarly to the inspection device 104. Accordingly, it is possible to improve the inspection accuracy of the DUT 65. Further, according to the inspection device 105, since it is not indispensable to move the probes 21 to 23, the probes 31 to 33, and the probes 51 and 52, the up-and-down driving units 91 to 93 may be unnecessary.

Sixth Embodiment

Figure 18:
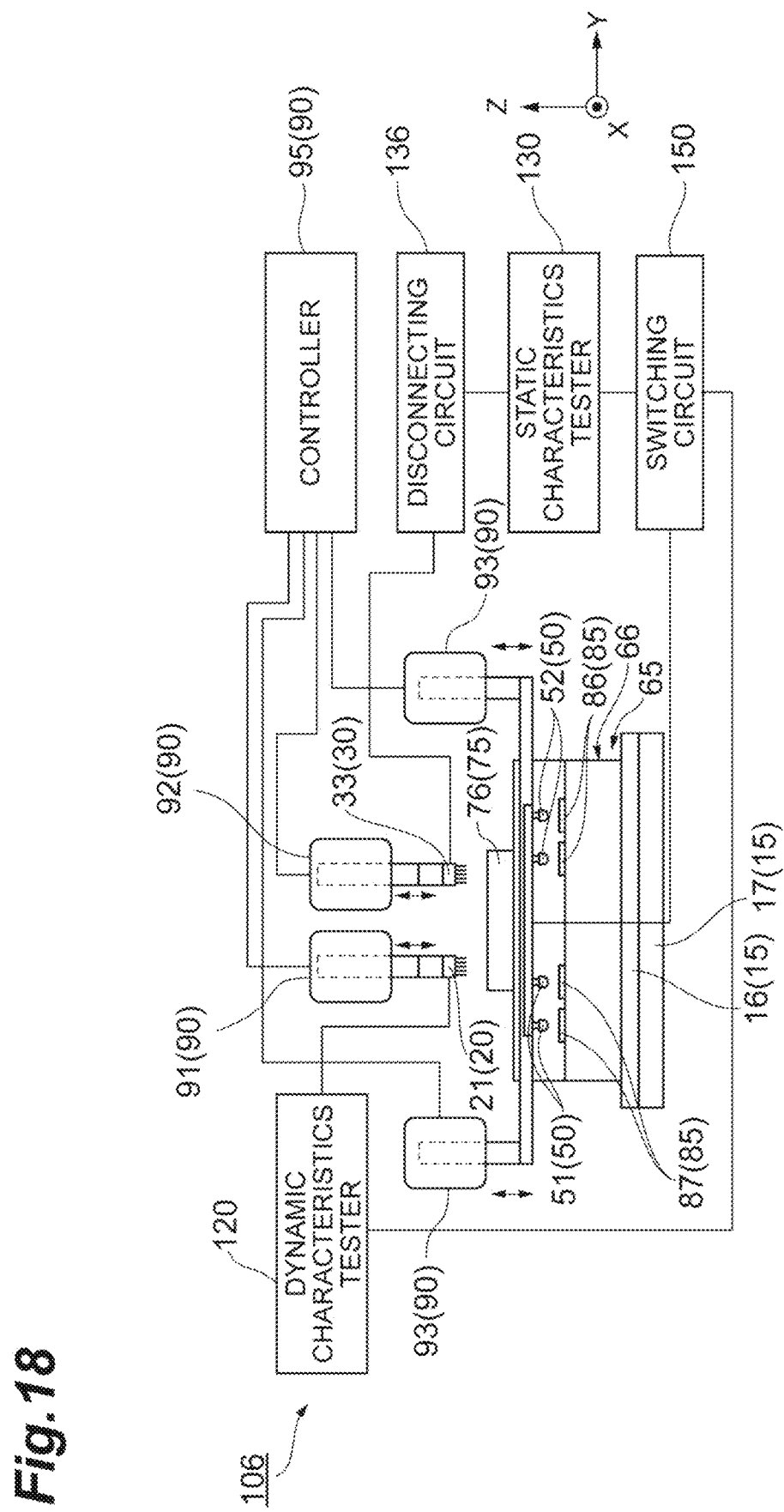
FIG. 18 is a front view of an inspection device according to a sixth embodiment.

FIG. 18 is a front view of an inspection device 106 according to a sixth embodiment. The inspection device 106 is different, as compared with the inspection device 104, particularly in content controlled by the control device 90. Note that in an exemplary operation of the inspection device 106 described later, the up-and-down driving units 91 to 93 are used. For this reason, only the up-and-down driving units 91 to 93 of the up-and-down driving units 91 to 94 are illustrated in FIG. 18 and in FIG. 19 described later.

In the inspection device 106, the control device 90, by moving the probes 21 to 23 and the probes 31 to 33 in the up-and-down direction, switches the contact state among the probes 21 to 23, the probes 31 to 33, and the electrode 75 between the dynamic characteristics test state and the static characteristics test state.

In the inspection device 106, in an initial state, the probes 21 to 23 and the probes 31 to 33 are separated from the electrode 75 of the DUT 65.

Figure 19:
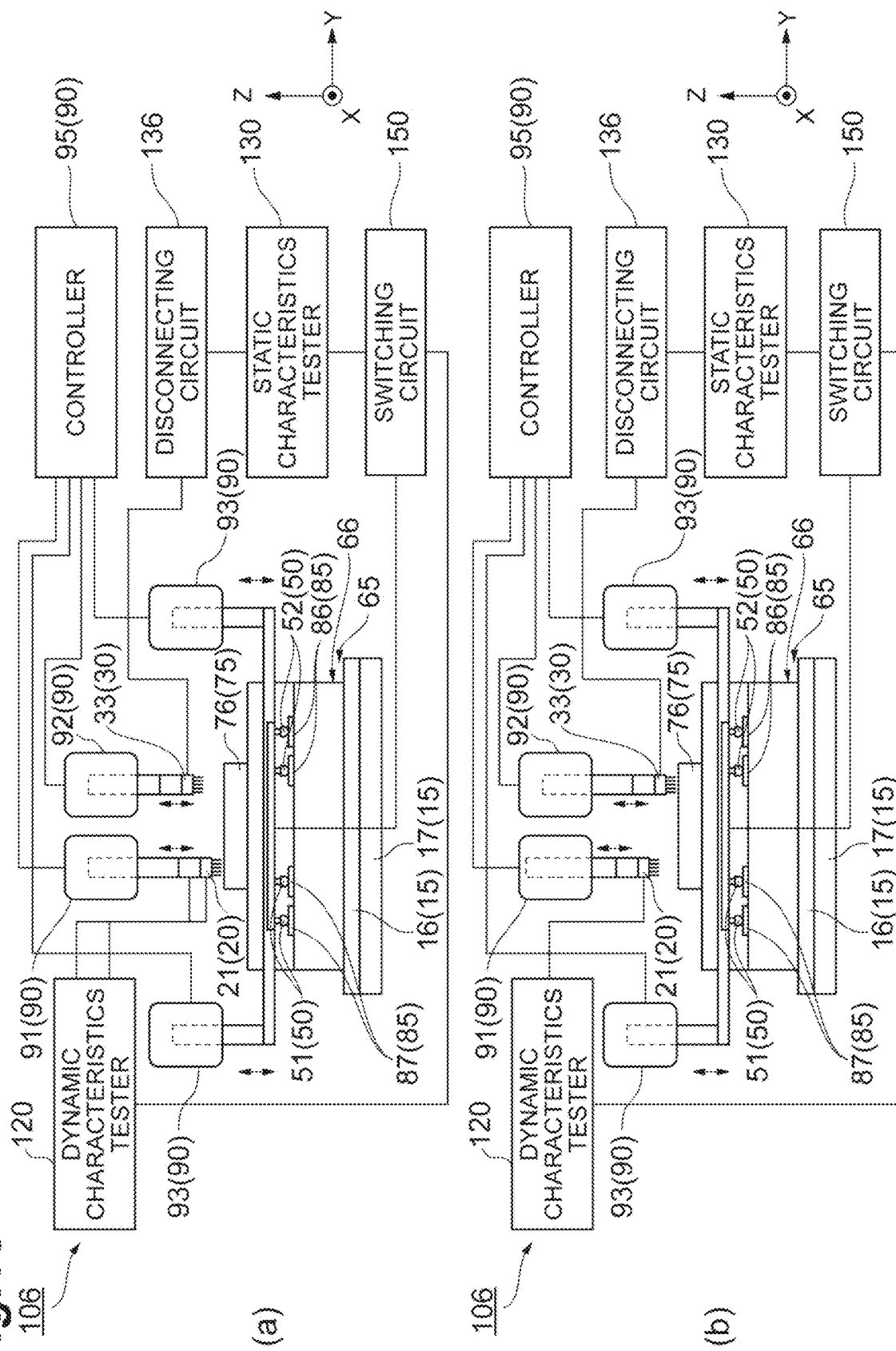
FIG. 19 is a diagram illustrating an operation example of the inspection device according to the sixth embodiment.

FIG. 19 is a diagram illustrating an operation example of the inspection device 106. As shown in (a) of FIG. 19, the controller 95 moves the probes 21 to 23 downward by controlling the up-and-down driving unit 91 from a state that the DUT 65 is placed on the stage 16. By doing so, the probes 21 to 23 are brought into contact with the electrode 75 of the DUT 65 from the upper part of the DUT 65. Moreover, the controller 95 moves the probes 51 and 52 downward by controlling the up-and-down driving unit 93. By doing so, the probes 51 and 52 are brought into contact with the electrode 75 of the DUT 65 from the upper part of the DUT 65. As for the probes 31 to 33, an initial state (i.e., a state of being separated from the electrode 75 of the DUT 65) is kept. In this way, the control device 90 sets the contact state among the probes 21 to 23, the probes 31 to 33, and the electrode 75 into the dynamic characteristics test state. In this dynamic characteristics test state, the dynamic characteristics test is performed by the dynamic characteristics tester 120 (dynamic characteristics test step).

In addition, as shown in (b) of FIG. 19, the controller 95 moves the probes 31 to 33 downward by controlling the up-and-down driving unit 92 from the initial state. By doing so, the probes 31 to 33 are brought into contact with the electrode 75 of the DUT 65 from the upper part of the DUT 65. Moreover, the controller 95 moves the probes 51 and 52 downward by driving the up-and-down driving unit 93. By doing so, the probes 51 and 52 are brought into contact with the electrode 75 of the DUT 65 from the upper part of the DUT 65. As for the probes 21 to 23, the initial state (i.e., a state of being separated from the electrode 75 of the DUT 65) is kept. In this way, the control device 90 sets the contact state among the probes 21 to 23, the probes 31 to 33, and the electrode 75 into the static characteristics test state. In the static characteristics test state, the static characteristics test is performed by the static characteristics tester 130 (static characteristics test step). While the static characteristics test is performed, the separation by the disconnecting circuit 136 is not carried out, and the probes 31 to 33 are electrically connected with the static characteristics tester 130.

According to also the operation of the inspection device 106 like this, the positional control is carried out by the control device 90 to switch the contact state among the probes 21 to 23, the probes 31 to 33, and the electrode 75 of the DUT 65 between the dynamic characteristics test state and the static characteristics test state, similarly to the inspection device 104. Accordingly, it is possible to improve the inspection accuracy of the DUT 65. Further, according to the inspection device 106, since it is not indispensable to move the stage 16, the up-and-down driving unit 94 may be unnecessary.

Note that in the inspection device 106, while the dynamic characteristics test is performed, since the probes 31 to 33 are separated from the electrode 75 of the DUT 65, the probes 31 to 33 is not required to be electrically disconnected from the static characteristics tester 130 by the disconnecting circuit 136. For this reason, the probes 31 to 33 may be electrically connected with the static characteristics tester 130 not via the disconnecting circuit 136, and in this case, the inspection device 106 is configured to not include the disconnecting circuit 136. Of course, in the inspection device 106, the dynamic characteristics test may be performed in a state that all of the probes 21 to 23 and the probes 31 to 33 are brought into contact with the electrode 75 of the DUT 65, and in this case, while the dynamic characteristics test is performed, the probes 31 to 33 are electrically disconnected from the static characteristics tester 130 by the disconnecting circuit 136.

[Detailed Configuration of Disconnecting Circuit]

Figure 20:
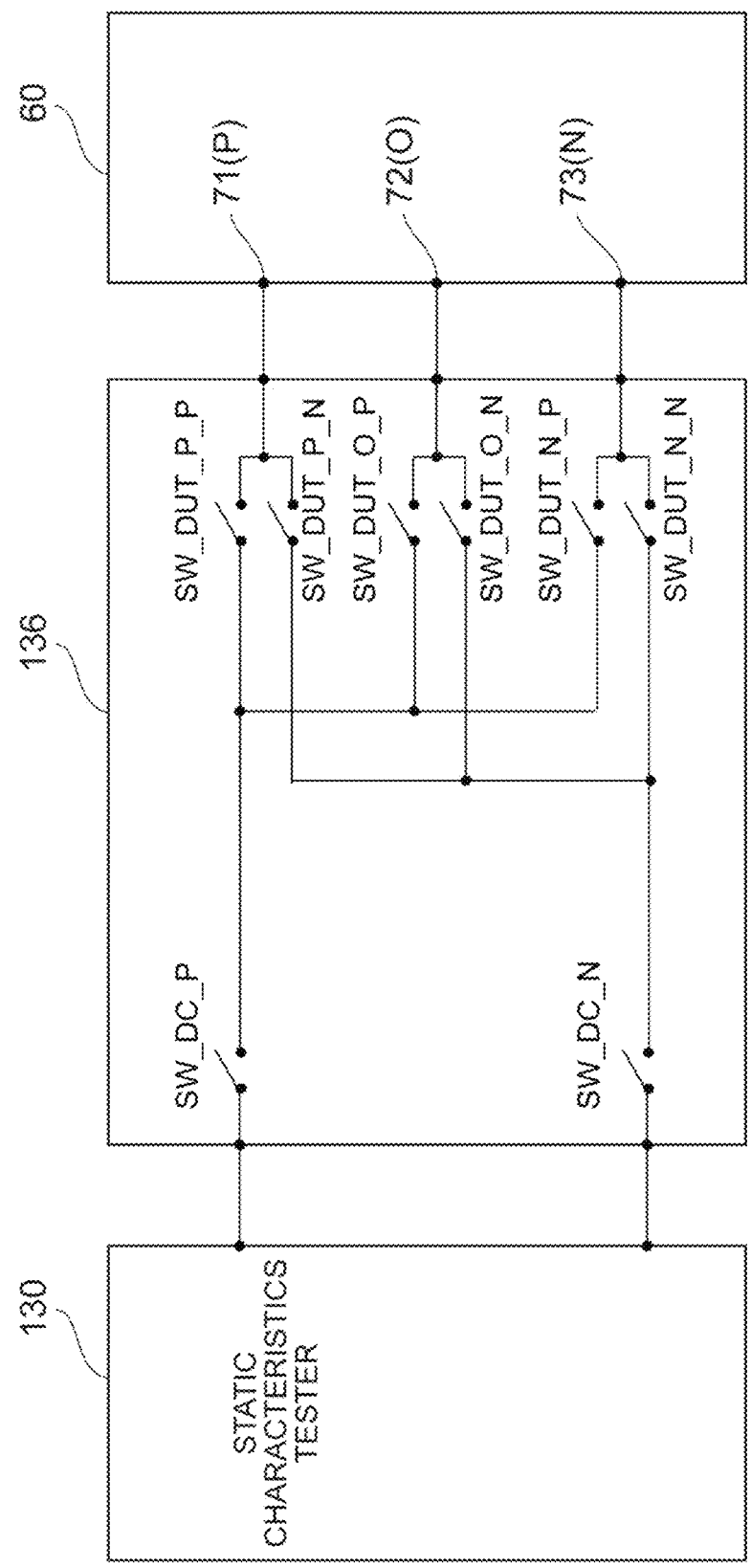
FIG. 20 is a diagram illustrating a detailed configuration of a disconnecting circuit.

Next, a description is given of a detailed configuration of the disconnecting circuit 136 with reference to FIG. 20. As shown in FIG. 20, the disconnecting circuit 136 includes a plurality of switch elements. A switch SW_DC_P is used to mainly switch between the electrical connection and disconnection of a terminal on a positive side of the static characteristics tester 130 with and from the disconnecting circuit 136. A switch SW_DC_N is used to mainly switch between the electrical connection and disconnection of a terminal on a negative side of the static characteristics tester 130 with and from the disconnecting circuit 136. A switch SW_DUT_P_P, a switch SW_DUT_O_P, and a SW_DUT_N_P each are used to mainly switch between the electrical connection and disconnection of the terminal on the positive side of the static characteristics tester 130 with and from the P-pole electrode 71, the output electrode 72, and the N-pole electrode 73, respectively, of the DUT 60. A switch SW_DUT_P_N, a switch SW_DUT_O_N, and a switch SW_DUT_N_N each are used to mainly switch between the electrical connection and disconnection of the terminal on the negative side of the static characteristics tester 130 with and from the P-pole electrode 71, the output electrode 72, and the N-pole electrode 73, respectively, of the DUT 60. Each switch is controlled by, for example, a control circuit not shown included in the disconnecting circuit 136. The control circuit receives control signals from the controller 45 (or the controller 95) to control each switch, for example. This allows the operations the probes 21 to 23, probes 31 to 33, and probes 51 and 52 coordinate with the operation of the disconnecting circuit 136.

Figure 21:
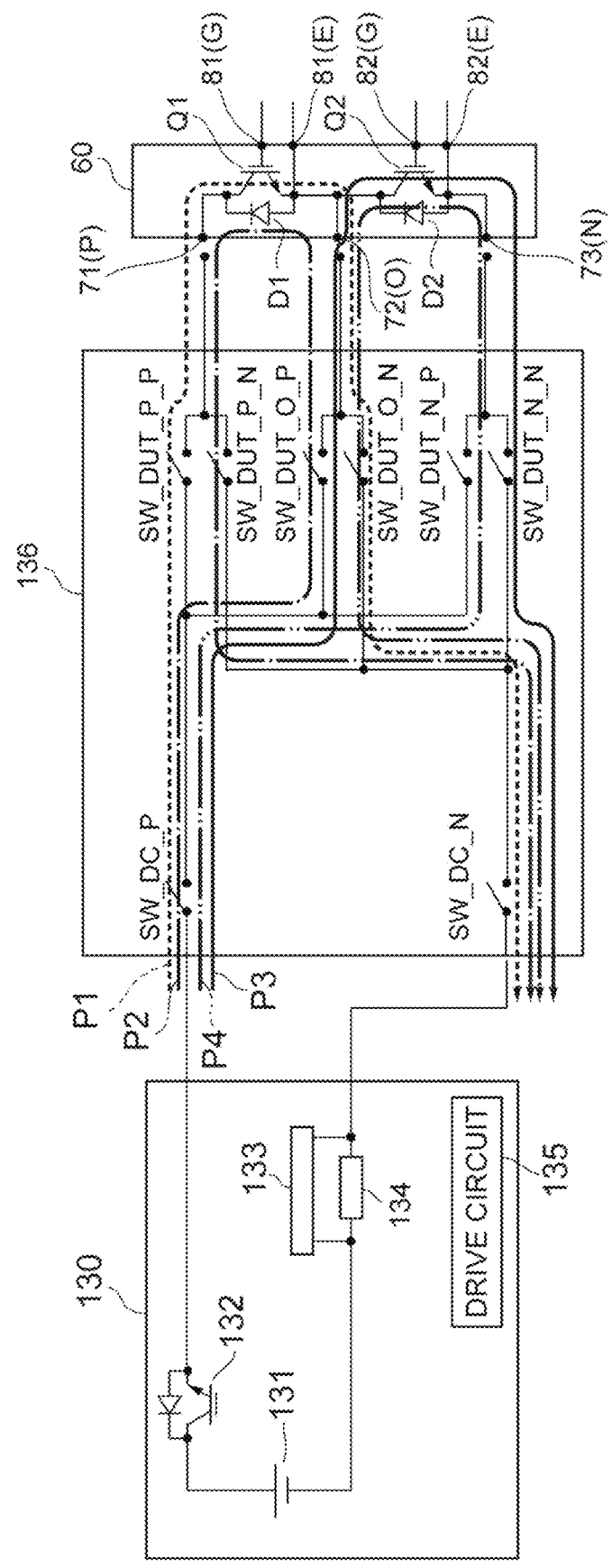
FIG. 21 is a diagram illustrating a current path by way of the disconnecting circuit.

FIG. 21 is a diagram illustrating a current path by way of the disconnecting circuit 136. As shown in FIG. 21, four paths P1 to P4 as the current paths are attained by way of the disconnecting circuit 136.

The path P1 is a current path attained when the switch SW_DC_P, the switch SW_DUT_P_P, the SW_DUT_O_N, and the switch SW_DC_N are in a conductive state (ON) and other switches are in a nonconductive state (OFF). The current flowing through the path P1 causes, for example, the ON-voltage of the transistor Q1 in the upper arm to be measured.

The path P2 is a current path attained when the switch SW_DC_P, the switch SW_DUT_O_P, the switch SW_DUT_P_N, and the switch SW_DC_N are ON and other switches are OFF. The current flowing through the path P2 causes, for example, the ON-voltage of the diode D1 in the upper arm to be measured.

The path P3 is a current path attained when the switch SW_DC_P, the switch SW_DUT_O_P, the switch SW_DUT_N_N, and the switch SW_DC_N are ON and other switches are OFF. The current flowing through the path P3 causes, for example, the ON-voltage of the transistor Q2 in the lower arm to be measured.

The path P4 is a current path attained when the switch SW_DC_P, the switch SW_DUT_N_P, the switch SW_DUT_O_N, and the switch SW_DC_N are ON and other switches are OFF. The current flowing through the path P4 causes, for example, the ON-voltage of the diode D2 in the lower to be measured.

Figure 22:
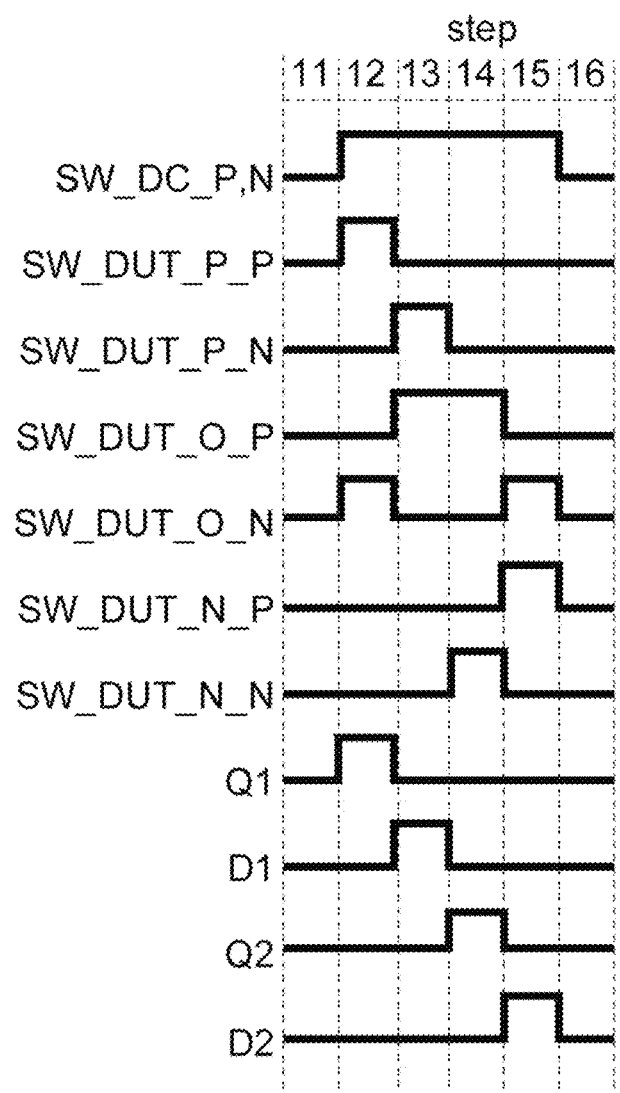
FIG. 22 is a timing chart showing a relationship between ON and OFF of each switch in a disconnecting circuit and an ON-voltage of each of transistors and diodes of a DUT.

FIG. 22 is a timing chart showing a relationship between ON and OFF of each switch in the disconnecting circuit 136 and the ON-voltage of each of the transistors Q1 and Q2 and diodes D1 and D2 of the DUT 60.

At step S11, each switch is set to OFF and a voltage is not generated in the transistors Q1 and Q2 and the diodes D1 and D2.

At step S12, when the switches SW_DC_P, N (SW_DC_P and SW_DC_N), the switch SW_DUT_P_P, and the switch SW_DUT_O_N are set to ON and other switches are set to OFF, and thereby, the path P1 be attained, a voltage is generated in the transistor Q1. This allows the ON-voltage of the transistor Q1 to be measured.

At step S13, when the switches SW_DC_P, N, the switch SW_DUT_P_N, and the switch SW_DUT_O_P are set to ON and other switches are set to OFF, and thereby, the path P2 be attained, a voltage is generated in the diode D1. This allows the ON-voltage of the diode D1 to be measured.

At step S14, when the switches SW_DC_P, N, the switch SW_DUT_O_P, and the switch SW_DUT_N_N are set to ON and other switches are set to OFF, and thereby, the path P3 be attained, a voltage is generated in the transistor Q2. This allows the ON-voltage of the transistor Q2 to be measured.

At step S15, when the switches SW_DC_P, N, the switch DUT_O_N, and the switch SW_DUT_N_P are set to ON and other switches are set to OFF, and thereby, the path P4 be attained, a voltage is generated in the diode D2. This allows the ON-voltage of the diode D2 to be measured.

At step S16, all switches are set to OFF.

As described hereinabove, according to the disconnecting circuit 136, in the static characteristics test, the ON-voltages of all elements in the transistors Q1 and Q2 and diodes D1 and D2 can be measured by switching the respective switches. In addition, while the dynamic characteristics test is performed, all switches in the disconnecting circuit 136 are set to OFF, and thereby, the probes 31 to 33 are electrically disconnected from the static characteristics tester 130.

[Detailed Configuration of Switching Circuit]

Figure 23:
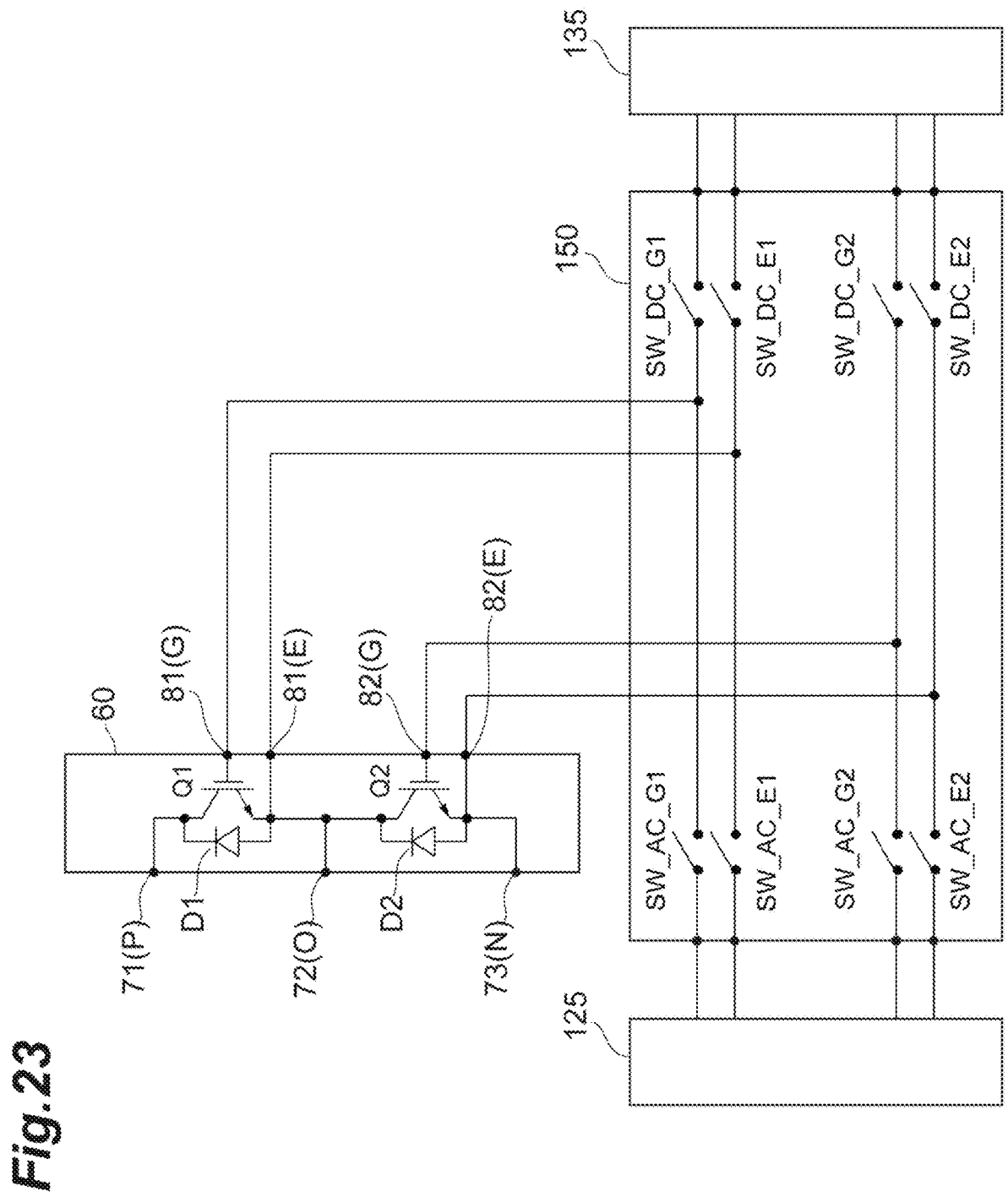
FIG. 23 is a diagram illustrating a detailed configuration of a switching circuit.

Next, a description is given of a detailed configuration of the switching circuit 150 with reference to FIG. 23. As shown in FIG. 23, the switching circuit 150 includes a plurality of switches. A switch SW_AC_G1 and a switch SW_AC_E1 each are used to mainly switch between the electrical connection and disconnection of the gate and emitter (control electrodes 81(G) and 81(E)), respectively, of the transistor Q1 with and from the drive circuit 125. A switch SW_AC_G2 and a switch SW_AC_E2 each are used to mainly switch between the electrical connection and disconnection of the gate and emitter (control electrodes 82(G) and 82(E)), respectively, of the transistor Q2 with and from the drive circuit 125. A switch SW_DC_G1 and a switch SW_DC_E1 each are used to mainly switch between the electrical connection and disconnection of the gate and emitter, respectively, of the transistor Q1 with and from the drive circuit 135. A switch SW_DC_G2 and a switch SW_DC_E2 each are used to mainly switch between the electrical connection and disconnection of the gate and emitter, respectively, of the transistor Q2 with and from the drive circuit 135. Each switch is controlled by, for example, a control circuit not shown included in the switching circuit 150. The control circuit receives control signals from the controller 45 (or the controller 95) to control each switch, for example. This allows the operations of the probes 21 to 23, probes 31 to 33, and probes 51 and 52 coordinate with the operation of the switching circuit 150.

Figure 24:
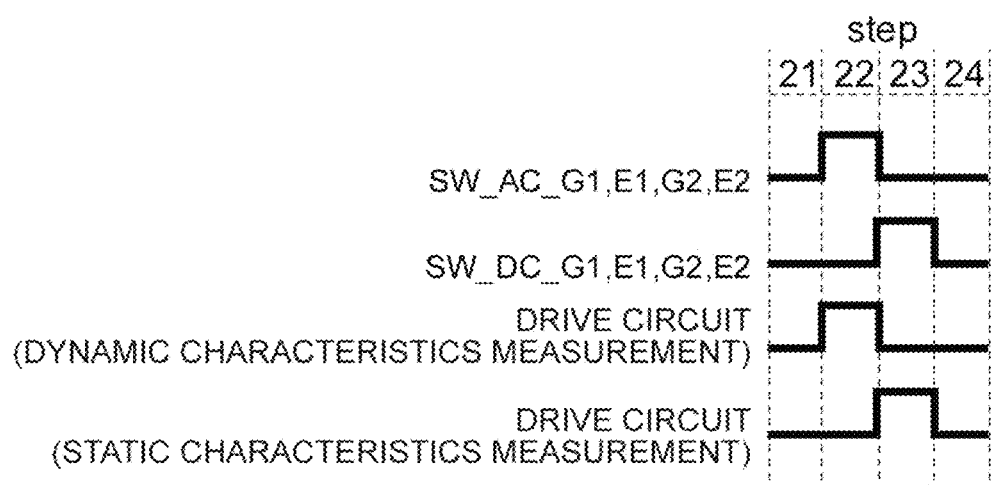
FIG. 24 is a timing chart showing a relationship between ON and OFF of each switch in a switching circuit and an operation state of each of a drive circuit of a dynamic characteristics tester and a drive circuit of a static characteristics tester.

FIG. 24 is a timing chart showing a relationship between ON and OFF of each switch in the switching circuit 150 and an operation state of each of the drive circuit 125 of the dynamic characteristics tester 120 and the drive circuit 135 of the static characteristics tester 130.

At step S21, the inspection device is in a state before the measurement by the dynamic characteristics test and the static characteristics test is started, and each switch is set to a nonconductive state (OFF) and the drive circuit 125 and the drive circuit 135 are not operating.

At step S22, the switch SW_AC_G1, the switch SW_AC_E1, the switch SW_AC_G2, and the switch SW_AC_E2 (switches SW_AC_G1, E1, G2, and E2) are set to ON and other switches are set to OFF. Additionally, the drive circuit 125 operates. By doing so, the dynamic characteristics test is performed.

At step S23, the switch SW_DC_G1, the switch SW_DC_E1, the switch SW_DC_G2, and the switch SW_DC_E2 (switches SW_DC_G1, E1, G2, and E2) are set to ON and other switches are set to OFF. Additionally, the drive circuit 135 operates. By doing so, the static characteristics test is performed.

At step S24, all switches are set to OFF in response to the measurement by the dynamic characteristics test and the static characteristics test being completed. Additionally, the drive circuit 125 and the drive circuit 135 are not operating.

As described hereinabove, according to the switching circuit 150, it is possible to continuously perform the dynamic characteristics test and the static characteristics test by switching the connection of the drive circuit 125 and the drive circuit 135 with the DUT 60. Note that an order in which the dynamic characteristics test and the static characteristics test are performed is not specifically limited.

Hereinabove, an embodiment of the present disclosure is described, but the present invention in not limited to the above embodiments. In the above embodiments, each element of the probes 21 to 23, the probes 31 to 33, the probes 51 and 52, and the stages 11 and 16 is moved by the control device 40 or 90 in the up-and-down direction, but the moving direction of each element by the control device 40 or 90 is not limited to the up-and-down direction. The moving direction of each element may be a direction by means of which the dynamic characteristics test state and the static characteristics test state can be switched by changing the distances between the probes 21 to 23 and probes 31 to 33 and the electrodes 70 and 75. The positions of the probes 21 to 23 and the positions of the probes 31 to 33 may be replaced with each other within a scope not departing from a similar gist. For example, the positions of the respective probes with respect to the DUT may be inverted up and down.

Further, in the above embodiments, the description is given of the case where the DUTs 60 and 65 each are a power module as the upper and lower arms of a one-phase inverter circuit, but the device under test is not limited to such a power module. For example, as for also a power module as the upper and lower arms of an inverter circuit of a two or more-phase, it is possible to perform the inspection, that is, the dynamic characteristics test and the static characteristics test by changing the number, shape or the like of the probes so as to conform the relevant power module.

REFERENCE SIGNS LIST 21 to 23 . . . probe (first probe), 31 to 33 . . . probe (second probe), 40, 90 . . . control device, 60, 65 DUT (device under test), 70, 75 . . . electrode, 100 to 106 . . . inspection device, 120 . . . dynamic characteristics tester, 130 . . . static characteristics tester, 136 . . . disconnecting circuit

The invention claimed is:

1. An inspection device comprising:
a stage for placing a device under test thereon;
a dynamic characteristics test probe for electrically connecting an electrode of the device under test with a dynamic characteristics tester for performing a dynamic characteristics test;
a static characteristics test probe for electrically connecting the electrode with a static characteristics tester for performing a static characteristics test; and
a control device configured to perform positional control by moving at least one of the stage, the dynamic characteristics test probe, and the static characteristics test probe,
wherein
the control device performs the positional control such that the dynamic characteristics test probe is set to a dynamic characteristics test state in which the dynamic characteristics test probe is brought into direct contact with the electrode when the dynamic characteristics test is performed, and performs the positional control such that the static characteristics test probe is set to a static characteristics test state in which the static characteristics test probe is brought into direct contact with the electrode while the dynamic characteristics test probe is separated from the electrode when the static characteristics test is performed.

2. The inspection device according to claim 1, further comprising:
a disconnecting circuit configured to electrically disconnect the static characteristics test probe from the static characteristics tester,
wherein
the control device performs the positional control such that a state of all of the dynamic characteristics test probe and the static characteristics test probe are in contact with the electrode as the dynamic characteristics test state, and
the disconnecting circuit electrically disconnects the static characteristics test probe from the static characteristics tester when the dynamic characteristics test is performed.

3. The inspection device according to claim 2, wherein
the dynamic characteristics test probe and the static characteristics test probe are arranged in such a way as to be brought into contact with the electrode from a lower part of the device under test, and
the control device, by moving the dynamic characteristics test probe in an up-and-down direction, switches a contact state among the dynamic characteristics test probe, the static characteristics test probe, and the electrode between the dynamic characteristics test state and the static characteristics test state.

4. The inspection device according to claim 2, wherein
the dynamic characteristics test probe is arranged in such a way as to be brought into contact with the electrode from a lower part of the device under test,
the static characteristics test probe is arranged in such a way as to be brought into contact with the electrode from an upper part of the device under test, and
the control device, by moving the static characteristics test probe and the dynamic characteristics test probe in an up-and-down direction, switches a contact state among the dynamic characteristics test probe, the static characteristics test probe, and the electrode between the dynamic characteristics test state and the static characteristics test state.

5. The inspection device according to claim 2, wherein
the dynamic characteristics test probe is arranged in such a way as to be brought into contact with the electrode from a lower part of the device under test,
the static characteristics test probe is arranged in such a way as to be brought into contact with the electrode from an upper part of the device under test, and the control device, by moving the stage in an up-and-down direction, switches a contact state among the dynamic characteristics test probe, the static characteristics test probe, and the electrode between the dynamic characteristics test state and the static characteristics test state.

6. The inspection device according to claim 2, wherein
the dynamic characteristics test probe and the static characteristics test probe are arranged in such a way as to be brought into contact with the electrode from an upper part of the device under test, and
the control device, by moving the stage and the dynamic characteristics test probe in an up-and-down direction, switches a contact state among the dynamic characteristics test probe, the static characteristics test probe, and the electrode between the dynamic characteristics test state and the static characteristics test state.

7. The inspection device according to claim 2, wherein
the static characteristics test probe is a spring probe capable of expansion and contraction in an up-and-down direction and is arranged in such a way as to be brought into contact with the electrode from an upper part of the device under test,
the dynamic characteristics test probe is arranged in such a way as to be brought into contact with the electrode from an upper part of the device under test, with an end of the dynamic characteristics test probe being positioned upper than an end of the static characteristics test probe, and
the control device, by moving the stage in the up-and-down direction, switches a contact state among the dynamic characteristics test probe, the static characteristics test probe, and the electrode between the dynamic characteristics test state and the static characteristics test state.

8. The inspection device according to claim 2, wherein
the dynamic characteristics test probe and the static characteristics test probe are arranged in such a way as to be brought into contact with the electrode from an upper part of the device under test, and
the control device, by moving the dynamic characteristics test probe and the static characteristics test probe in an up-and-down direction, switches a contact state among the dynamic characteristics test probe, the static characteristics test probe, and the electrode between the dynamic characteristics test state and the static characteristics test state.

9. The inspection device according to claim 1, wherein
the dynamic characteristics test probe and the static characteristics test probe are arranged in such a way as to be brought into contact with the electrode from a lower part of the device under test, and
the control device, by moving the dynamic characteristics test probe in an up-and-down direction, switches a contact state among the dynamic characteristics test probe, the static characteristics test probe, and the electrode between the dynamic characteristics test state and the static characteristics test state.

10. The inspection device according to claim 1, wherein
the dynamic characteristics test probe is arranged in such a way as to be brought into contact with the electrode from a lower part of the device under test,
the static characteristics test probe is arranged in such a way as to be brought into contact with the electrode from an upper part of the device under test, and
the control device, by moving the static characteristics test probe and the dynamic characteristics test probe in an up-and-down direction, switches a contact state among the dynamic characteristics test probe, the static characteristics test probe, and the electrode between the dynamic characteristics test state and the static characteristics test state.

11. The inspection device according to claim 1, wherein
the dynamic characteristics test probe is arranged in such a way as to be brought into contact with the electrode from a lower part of the device under test,
the static characteristics test probe is arranged in such a way as to be brought into contact with the electrode from an upper part of the device under test, and
the control device, by moving the stage in an up-and-down direction, switches a contact state among the dynamic characteristics test probe, the static characteristics test probe, and the electrode between the dynamic characteristics test state and the static characteristics test state.

12. The inspection device according to claim 1, wherein
the dynamic characteristics test probe and the static characteristics test probe are arranged in such a way as to be brought into contact with the electrode from an upper part of the device under test, and
the control device, by moving the stage and the dynamic characteristics test probe in an up-and-down direction, switches a contact state among the dynamic characteristics test probe, the static characteristics test probe, and the electrode between the dynamic characteristics test state and the static characteristics test state.

13. The inspection device according to claim 1, wherein
the static characteristics test probe is a spring probe capable of expansion and contraction in an up-and-down direction and is arranged in such a way as to be brought into contact with the electrode from an upper part of the device under test,
the dynamic characteristics test probe is arranged in such a way as to be brought into contact with the electrode from an upper part of the device under test, with an end of the dynamic characteristics test probe being positioned upper than an end of the static characteristics test probe, and
the control device, by moving the stage in the up-and-down direction, switches a contact state among the dynamic characteristics test probe, the static characteristics test probe, and the electrode between the dynamic characteristics test state and the static characteristics test state.

14. The inspection device according to claim 1, wherein
the dynamic characteristics test probe and the static characteristics test probe are arranged in such a way as to be brought into contact with the electrode from an upper part of the device under test, and
the control device, by moving the dynamic characteristics test probe and the static characteristics test probe in an up-and-down direction, switches a contact state among the dynamic characteristics test probe, the static characteristics test probe, and the electrode between the dynamic characteristics test state and the static characteristics test state.

15. An inspection method comprising:
a dynamic characteristics test step of bring a dynamic characteristics test probe into direct contact with an electrode of a device under test to perform a dynamic characteristics test; and
a static characteristics test step of bring a static characteristics test probe into direct contact with the electrode to perform a static characteristics test, wherein
in the static characteristics test step, positional control is performed such that the dynamic characteristics test probe is separated from the electrode by moving at least one of a stage placing the device under test thereon, the dynamic characteristics test probe, and the static characteristics test probe.

* * * * *